US009712187B2

(12) United States Patent
Abu-Surra et al.

(10) Patent No.: US 9,712,187 B2
(45) Date of Patent: Jul. 18, 2017

(54) SC-LDPC CODES FOR WIRELESS COMMUNICATION SYSTEMS: FRAMEWORK AND ZIGZAG-WINDOW DECODER

(71) Applicant: Samsung Electronics Co., Ltd., Suwon-si, Gyeonggi-do (KR)

(72) Inventors: Shadi Abu-Surra, Plano, TX (US); Eran Pisek, Plano, TX (US); Sridhar Rajagopal, Plano, TX (US); Rakesh Taori, McKinney, TX (US)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 29 days.

(21) Appl. No.: 14/823,744

(22) Filed: Aug. 11, 2015

(65) Prior Publication Data

US 2016/0164538 A1    Jun. 9, 2016

Related U.S. Application Data

(60) Provisional application No. 62/087,912, filed on Dec. 5, 2014, provisional application No. 62/109,404, filed on Jan. 29, 2015.

(51) Int. Cl.
*G11C 29/00* (2006.01)
*H03M 13/11* (2006.01)
*H03M 13/00* (2006.01)

(52) U.S. Cl.
CPC ...... *H03M 13/1128* (2013.01); *H03M 13/116* (2013.01); *H03M 13/1111* (2013.01); *H03M 13/1154* (2013.01); *H03M 13/1177* (2013.01); *H03M 13/618* (2013.01); *H03M 13/6306* (2013.01); *H03M 13/6362* (2013.01)

(58) Field of Classification Search
CPC ......... H03M 13/1128; H03M 13/1177; H03M 13/1111; H03M 13/1154; H03M 13/116
See application file for complete search history.

(56) References Cited

U.S. PATENT DOCUMENTS

2004/0123229 A1* 6/2004 Kim ................ H03M 13/09
714/800
2011/0047445 A1    2/2011 Roy et al.
(Continued)

OTHER PUBLICATIONS

International Search Report dated Mar. 22, 2016 in connection with International Application No. PCT/KR2015/013215 dated Mar. 22, 2016, 3 pages.
(Continued)

*Primary Examiner* — Sam Rizk

(57) ABSTRACT

A receiver, such as a mobile station or base station, includes a sliding window-decoder. An antenna in the receiver is configured to receive a protograph-based spatially coupled low density parity check (SC-LDPC) code from a transmitter. The sliding window-decoder is configured to perform a SC-LDPC decoding operation on the SC-LDPC code using a sliding window. The SC-LDPC code includes a parity check matrix. The sliding window includes a subset of protograph sections on which decoding calculations are iteratively performed. The sliding window-decoder performs a stopping rule configured to cease the decoding calculations as a function of a syndrome of one or more check nodes (CNs) in the sliding window.

29 Claims, 22 Drawing Sheets

(56) References Cited

U.S. PATENT DOCUMENTS

2013/0254633 A1* 9/2013 Obata ................ H03M 13/13
714/776
2014/0085114 A1 3/2014 Cideciyan et al.
2014/0086229 A1* 3/2014 Yosoku ................ H04L 1/0063
370/338

OTHER PUBLICATIONS

Written Opinion of the International Searching Authority dated Mar. 22, 2016 in connection with Application No. PCT/KR2015/013215 dated Mar. 22, 2016, 6 pages.

Daniel J. Costello, Jr., et al., "Spatially Coupled Sparse Codes on Graphs—Theory and Practice", arXiv:1310.372v1[cs.IT], Cornell University Library, Oct. 14, 2013, 13 pages.

Xiujie Huang et al., "Achievable Rates and Forward-Backward Decoding Algorithms for the Gaussian Relay Channels Under the One-Code Constraint", 2014 IEEE International Conference on Communications (ICC), Jun. 14, 2014, 7 pages.

Pablo M. Olmos et al., "Improving the Finite-Length Performance of Spatially Coupled LDPC Codes by Connecting Multiple Code Chains", arXiv:1402.7170v1 [cs.IT], Feb. 28, 2014, 16 pages.

* cited by examiner

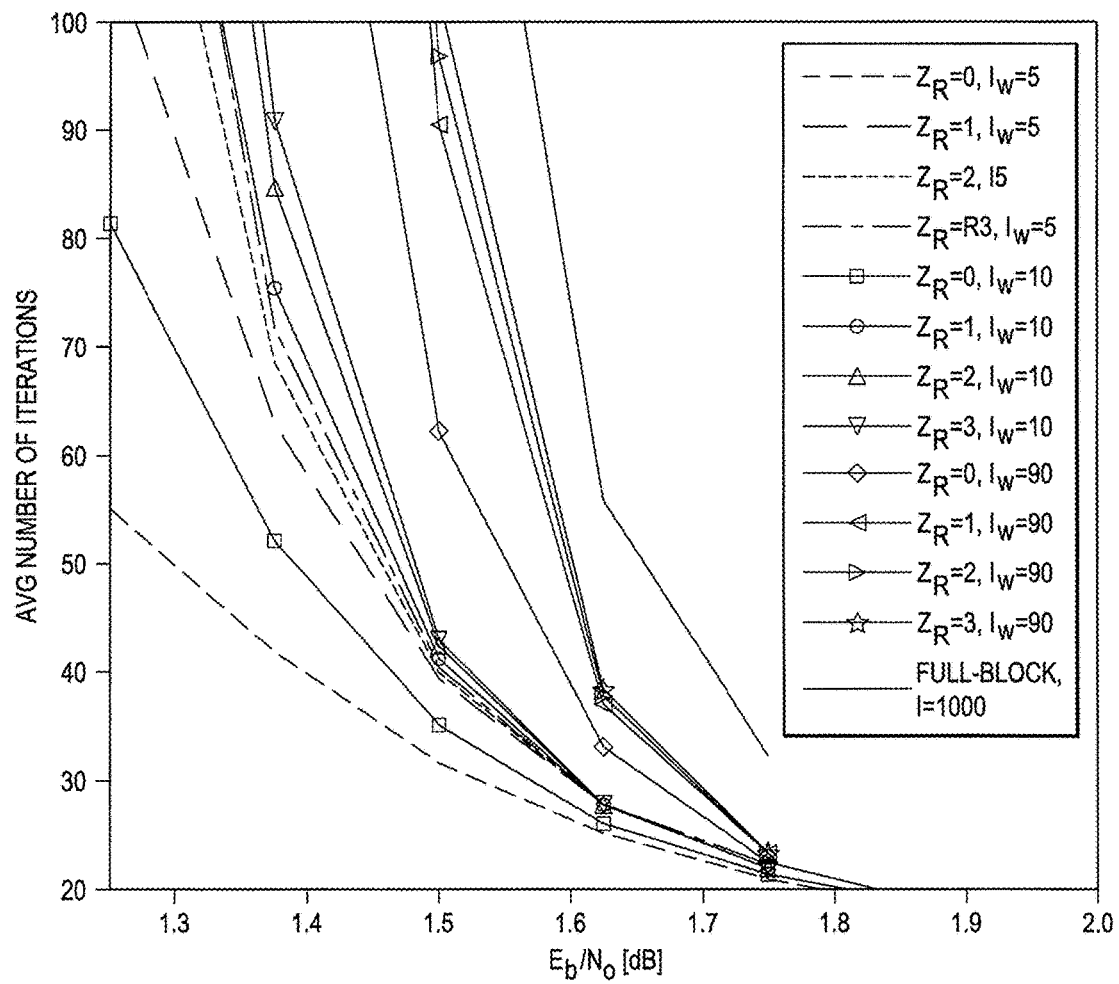

SC-LDPC CODES FOR WIRELESS COMMUNICATION SYSTEMS: FRAMEWORK AND ZIGZAG-WINDOW DECODER

CROSS-REFERENCE TO RELATED APPLICATION(S) AND CLAIM OF PRIORITY

The present application claims priority to U.S. Provisional Patent Application Ser. No. 62/087,912, filed Dec. 5, 2014, entitled "SC-LDPC CODES FOR WIRELSSS COMMUNICATION SYSTEMS: FRAMEWORK AND ZIGZAG-WINDOW DECODER" and U.S. Provisional Patent Application Ser. No. 62/109,404, filed Jan. 29, 2015, entitled "SPATIALLY-COUPLED LOW-DENSITY PARITY CHECK CODES: ZIGZAG WINDOW DECODING AND CODE-FAMILY DESIGN CONSIDERATIONS." The content of the above-identified patent documents are incorporated herein by reference.

TECHNICAL FIELD

The present application relates generally to wireless communications and, more specifically, to a encoding and decoding of data in a wireless communication system.

BACKGROUND

In information theory, a low-density parity-check (LDPC) code is an error correcting code for transmitting a message over a noisy transmission channel. LDPC codes are a class of linear block codes. While LDPC and other error correcting codes cannot guarantee perfect transmission, the probability of lost information can be made as small as desired. LDPC was the first code to allow data transmission rates close to the theoretical maximum known as the Shannon Limit. LDPC codes can perform with 0.0045 dB of the Shannon Limit. LDPC was impractical to implement when developed in 1963. Turbo codes, discovered in 1993, became the coding scheme of choice in the late 1990s. Turbo codes are used for applications such as deep-space satellite communications. LDPC requires complex processing but is the most efficient scheme discovered as of 2007. LDPC codes can yield a large minimum distance (hereinafter "$d_{min}$") and reduce decoding complexity.

SUMMARY

In a first embodiment, an apparatus is provided. The apparatus includes an input buffer configured to receive a protograph-based spatially coupled low density parity check (SC-LDPC) code from a transmitter. The apparatus also includes a decoder processing circuitry configured to perform a SC-LDPC decoding operation on the SC-LDPC code, the SC-LDPC code comprising a parity check matrix. The SC-LDPC decoding operation includes a sliding window comprising a subset of protograph sections on which decoding calculations are iteratively performed. The SC-LDPC decoding operation also includes a stopping rule configured to cease the decoding calculations as a function of a syndrome of one or more check nodes (CNs) in the sliding window.

In a second embodiment, a method is provided. The method includes receiving a protograph-based spatially coupled low density parity check (SC-LDPC) code from a transmitter. The method also includes performing an SC-LDPC decoding operation on the SC-LDPC code, the SC-LDPC code comprising a parity check matrix. The SC-LDPC decoding operation includes a sliding window. The sliding window includes a subset of protograph sections on which decoding calculations are iteratively performed. The SC-LDPC decoding operation also includes a stopping rule configured to cease the decoding calculations as a function of a syndrome of one or more check nodes (CNs) in the sliding window.

In a third embodiment, a receiver is provided. The receiver includes at least one antenna and a sliding window-decoder. The antenna is configured to receive a protograph-based spatially coupled low density parity check (SC-LDPC) code from a transmitter. The sliding window-decoder is configured to perform a SC-LDPC decoding operation on the SC-LDPC code using a sliding window. The SC-LDPC code includes a parity check matrix. The sliding window includes a subset of protograph sections on which decoding calculations are iteratively performed. The sliding window-decoder performs a stopping rule configured to cease the decoding calculations as a function of a syndrome of one or more check nodes (CNs) in the sliding window.

Other technical features may be readily apparent to one skilled in the art from the following figures, descriptions, and claims.

Before undertaking the DETAILED DESCRIPTION below, it may be advantageous to set forth definitions of certain words and phrases used throughout this patent document. The term "couple" and its derivatives refer to any direct or indirect communication between two or more elements, whether or not those elements are in physical contact with one another. The terms "transmit," "receive," and "communicate," as well as derivatives thereof, encompass both direct and indirect communication. The terms "include" and "comprise," as well as derivatives thereof, mean inclusion without limitation. The term "or" is inclusive, meaning and/or. The phrase "associated with," as well as derivatives thereof, means to include, be included within, interconnect with, contain, be contained within, connect to or with, couple to or with, be communicable with, cooperate with, interleave, juxtapose, be proximate to, be bound to or with, have, have a property of, have a relationship to or with, or the like. The term "controller" means any device, system or part thereof that controls at least one operation. Such a controller may be implemented in hardware or a combination of hardware and software and/or firmware. The functionality associated with any particular controller may be centralized or distributed, whether locally or remotely. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

Definitions for other certain words and phrases are provided throughout this patent document. Those of ordinary skill in the art should understand that in many if not most instances, such definitions apply to prior as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts:

FIG. 6 illustrates an example of a (3, 6, 720) protograph-based SC-LDPC code with lifting factor Z=112 according to this disclosure;

FIG. 7 illustrates a sliding-window decoder according to this disclosure;

FIGS. 12A and 12B illustrate performances of respective zigzag-window decoders according to this disclosure;

Figure 16:
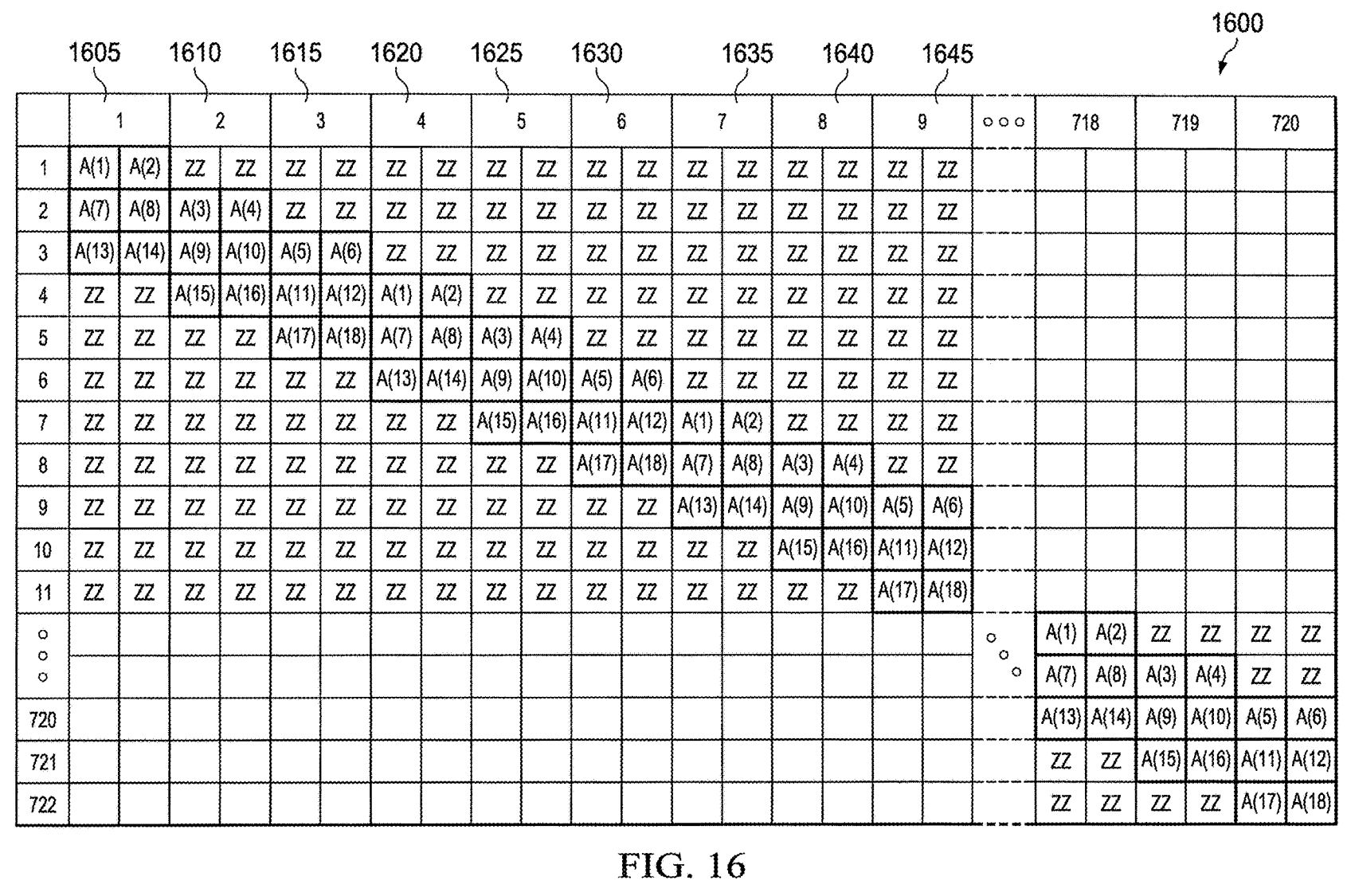

FIG. 16 illustrates a (3, 6) protograph-based SC-LDPC code according to this disclosure;

Figure 17:
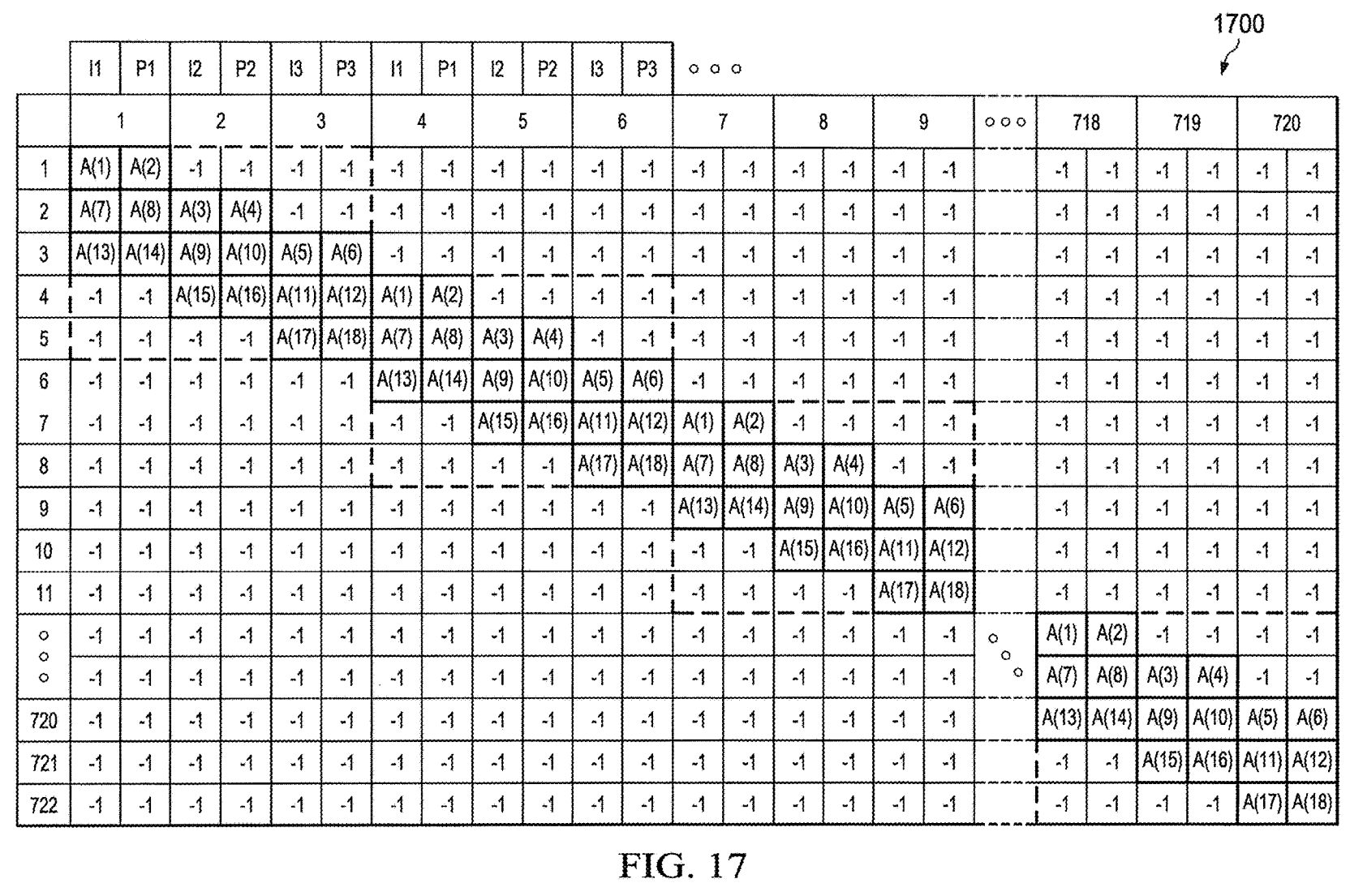

FIG. 17 illustrates a rate-1/2 protograph-based SC-LDPC code punctured to rate-3/4 using a puncturing pattern according to this disclosure;

FIG. 28 illustrates Exemplary SC-LDPC code families based on shortening according to this disclosure.

DETAILED DESCRIPTION

Figure 1:
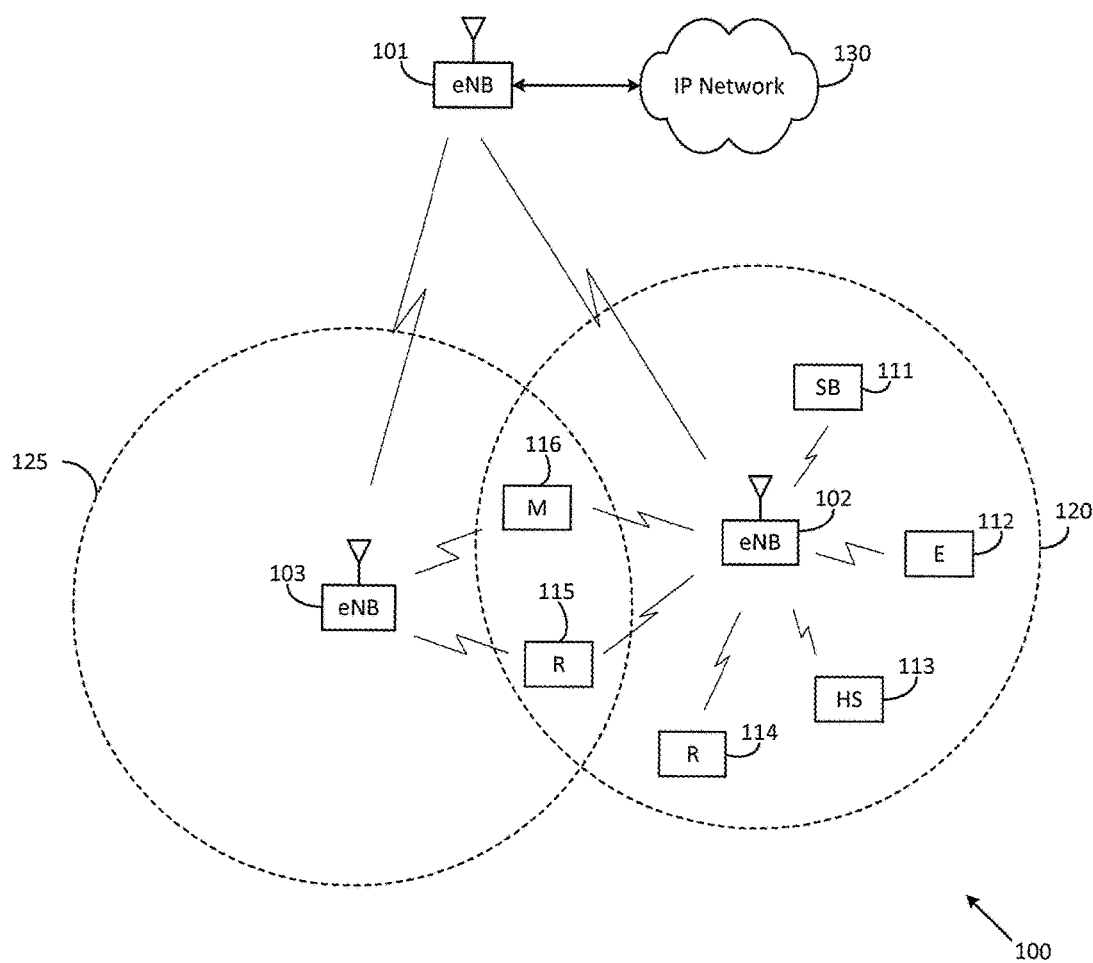
FIG. 1 illustrates an example wireless network according to this disclosure.

FIGS. 1 through 28, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged wireless communications system.

The following documents are incorporated by reference as if set forth in the disclosure in their entirety: D. J. Costello, Jr., L. Dolecek, T. E. Fuja, J. Kliewer, D. G. M. Mitchell, and R. Smarandache, "Spatially Coupled Sparse Codes on Graphs—Theory and Practice," arXive, October 2013 (REF-1); Michael Lentmaier, Maria Mellado Prenda, and Gerhard P. Fettweis, "Efficient Message Passing Scheduling for Terminated LDPC Convolutional Codes," IEEE ISIT, August 2011 (REF-2); Shrinivas Kudekar, Tom Richardsony and Rudiger Urbanke, "Threshold Saturation via Spatial Coupling: Why Convolutional LDPC Ensembles Perform so well over the BEC," arXiv, October 2010 (REF-3); Vikram Arkalgud Chandrasetty, Sarah J. Johnson and Gottfried Lechner, "Memory Efficient Quasi-Cyclic Spatially Coupled LDPC Codes", arXive October 2013 (REF-4); and Najeeb ul Hassan, Michael Lentmaier, and Gerhard P. Fettweis, "Comparison of LDPC Block and LDPC Convolutional Codes Based on their Decoding Latency," IEEE ISTC August 2012 (REF-5); D. Hocevar, "A reduced complexity decoder architecture via layered decoding of LDPC codes," *IEEE Workshop on Signal Processing Systems,* 2004., pp. 107-112, October 2004 (REF-6); Shadi Abu-Surra, Eran Pisek, Thomas Henige, and Sridhar Rajagopal, "Low-Power Dual Quantization-Domain Decoding for LDPC Codes," IEEE Globecom 2014 (REF-7); M. Davey and D. J. Mackay, "Low density parity check codes over GF(q)," IEEE Commun. Letters, vol. 2, pp. 165-167, June 1998 (REF-8); J. Chen, A Dholakia, E. Eleftheriou, M. Fossorier, "Reduced-Complexity Decoding of LDPC Codes," IEEE Trans. on Commun., vol. 53, pp. 1288-1299, August 2005 (REF-9); R. G. Gallager, "Low-density parity-check codes", Cambridge, Mass.: MIT Press, 1963 (REF-10); D. J. C. MacKay and R. M. Neal, "Near Shannon limit performance of low density parity check codes," *Electronics Letters*, vol. 32, pp. 1645-1646, August 1996 (REF-11); IEEE 802.11ad standard spec., Part 11: Wireless LAN medium access control (MAC) and physical layer (PHY) Specifications, Amendment 3: Enhancements for very high throughput in the 60 GHz Band, (REF-12); R. G. Gallager, "A simple derivation of the coding theorem and some applications," *IEEE Trans. on Information Theory*, vol. 11, pp. 3-18, January 1965 (REF-13); IEEE 802.11n-2009 standard spec., Part 11: Wireless LAN Medium Access Control (MAC) and Physical Layer (PHY) Specifications Amendment 5: Enhancements for Higher Throughput, retrieved from the Internet <URL: http://standards.ieee.org/getieee802/download/802.11ad-2012.pd (REF-14); 3GPP, "Evolved Universal Terrestrial Radio Access (E-UTRA); Physical channels and modulation; (release 11)," 3GPP, 2013, retrieved from the Internet <URL: http://www.3gpp.org/ftp/Specs/html-info/36211.htm> (REF-15); D. J. Costello, Jr., L. Dolecek, T. E. Fuja, J. Kliewer, D. G. M. Mitchell, and R. Smarandache, "Spatially Coupled Sparse Codes on Graphs—Theory and Practice," arXive, October 2013, (REF-16); Michael Lentmaier, Maria Mellado Prenda, and Gerhard P. Fettweis, "Efficient Message Passing Scheduling for Terminated LDPC Convolutional Codes," *IEEE ISIT*, August 2011, (REF-17); S. Abu-Surra, E. Pisek, and T. Henige, "Gigabit Rate Achieving Low-Power LDPC Codes: Design and Architecture," *IEEE Wireless Commun. And Networking Conf.*, March 2011, (REF-18); and D. Divsalar, S. Dolinar, and C. Jones, "Construction of Protograph LDPC Codes with Linear Minimum Distance," *IEEE ISIT*, July 2006, (REF-19).

In communication systems, channel coding is important to obtain capacity approaching performance. Many schemes such as turbo codes and LDPC block codes are used in wireless communication standards. However, these coding schemes have limitations. For example, the structure of the turbo codes doesn't provide enough parallel processing capability needed to achieve very multiple Giga bits per second throughput. Alternatively, the structure of the LDPC block codes provides large parallel processing factor, but its granularity is limited by the fixed block size of the code.

Spatially-coupled low-density parity-check (SC-LDPC) codes are new capacity achieving codes that combine the advantages of both turbo codes and LDPC block codes. SC-LDPC codes have the potential of achieving high data rates, and they have small granularity compared to LDPC block codes.

Embodiments of the present disclosure are related to the design and decoding of SC-LDPC codes. Certain embodiments of the present disclosure deal with the SC-LDPC codeword structure (especially, termination) and how to realize it in a wireless communication standard. Though some of these embodiments are tailored toward WLAN systems, other embodiments have lower level of details to cover adoption in other standards such as mobile communication standards. Certain embodiments of the present disclosure propose a new decoder, reference as a zigzag-window decoder, that is capable of reducing the number of iterations and improve the SC-LDPC codes performance.

Embodiments of the present disclosure propose SC-LDPC code framework for adding SC-LDPC in communication systems. SC-LDPC codes have high parallel factor capable of achieving multiple gigabits per seconds (GB/s) with low power consumption. They have low granularity and scalable code-word length to enable high efficiency in dynamic wireless environment. Also, certain embodiments of the present disclosure propose a new decoding scheme, such as configured for use by a new zigzag-window decoder, that is capable of achieving better performance than the sliding-window decoder.

FIG. 1 illustrates an example wireless network 100 according to this disclosure. The embodiment of the wireless network 100 shown in FIG. 1 is for illustration only. Other embodiments of the wireless network 100 could be used without departing from the scope of this disclosure.

As shown in FIG. 1, the wireless network 100 includes an eNodeB (eNB) 101, an eNB 102, and an eNB 103. The eNB 101 communicates with the eNB 102 and the eNB 103. The eNB 101 also communicates with at least one Internet Protocol (IP) network 130, such as the Internet, a proprietary IP network, or other data network.

Depending on the network type, other well-known terms may be used instead of "eNodeB" or "eNB," such as "base station" or "access point." For the sake of convenience, the terms "eNodeB" and "eNB" are used in this patent document to refer to network infrastructure components that provide wireless access to remote terminals. Also, depending on the network type, other well-known terms may be used instead of "user equipment" or "UE," such as "mobile station," "subscriber station," "remote terminal," "wireless terminal," or "user device." For the sake of convenience, the terms "user equipment" and "UE" are used in this patent document to refer to remote wireless equipment that wirelessly accesses an eNB, whether the UE is a mobile device (such as a mobile telephone or smartphone) or is normally considered a stationary device (such as a desktop computer or vending machine).

The eNB 102 provides wireless broadband access to the network 130 for a first plurality of user equipments (UEs) within a coverage area 120 of the eNB 102. The first plurality of UEs includes a UE 111, which may be located in a small business (SB); a UE 112, which may be located in an enterprise (E); a UE 113, which may be located in a WiFi hotspot (HS); a UE 114, which may be located in a first residence (R); a UE 115, which may be located in a second residence (R); and a UE 116, which may be a mobile device (M) like a cell phone, a wireless laptop, a wireless PDA, or the like. The eNB 103 provides wireless broadband access to the network 130 for a second plurality of UEs within a coverage area 125 of the eNB 103. The second plurality of UEs includes the UE 115 and the UE 116. In some embodiments, one or more of the eNBs 101-103 may communicate with each other and with the UEs 111-116 using 5G, LTE, LTE-A, WiMAX, or other advanced wireless communication techniques.

Dotted lines show the approximate extents of the coverage areas 120 and 125, which are shown as approximately circular for the purposes of illustration and explanation only. It should be clearly understood that the coverage areas associated with eNBs, such as the coverage areas 120 and 125, may have other shapes, including irregular shapes, depending upon the configuration of the eNBs and variations in the radio environment associated with natural and man-made obstructions.

As described in more detail below, one or more of eNBs 101-103 is configured to encode data using SC-LDPC codes and a zig-zag window as described in embodiments of the present disclosure. In certain embodiments, one or more of eNBs 101-103 is configured to decode data using SC-LDPC codes and a zig-zag window as described in embodiments of the present disclosure. In certain embodiments, one or more of UEs 111-116 is configured to encode data using SC-LDPC codes and a zig-zag window as described in embodiments of the present disclosure. In certain embodiments, one or more of UEs 111-116 is configured to decode data using SC-LDPC codes and a zig-zag window as described in embodiments of the present disclosure.

Although FIG. 1 illustrates one example of a wireless network 100, various changes may be made to FIG. 1. For example, the wireless network 100 could include any number of eNBs and any number of UEs in any suitable arrangement. Also, the eNB 101 could communicate directly with any number of UEs and provide those UEs with wireless broadband access to the network 130. Similarly, each eNB 102-103 could communicate directly with the network 130 and provide UEs with direct wireless broadband access to the network 130. Further, the eNB 101, 102, and/or 103 could provide access to other or additional external networks, such as external telephone networks or other types of data networks.

Figure 2A:
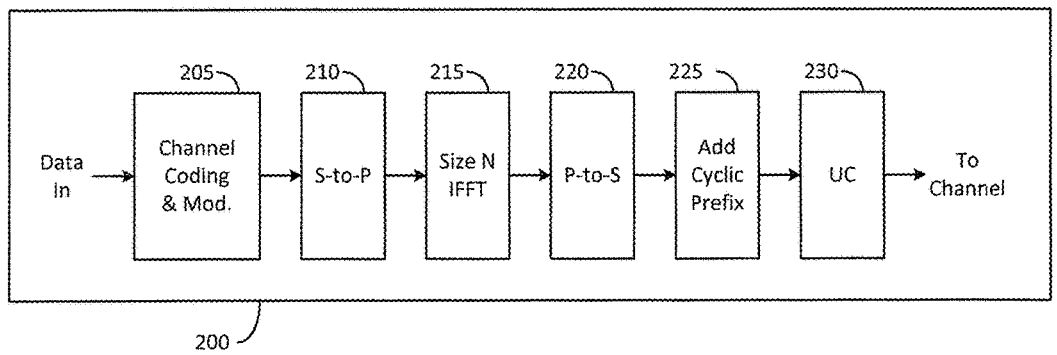
FIGS. 2A and 2B illustrate example wireless transmit and receive paths according to this disclosure.
Figure 2B:
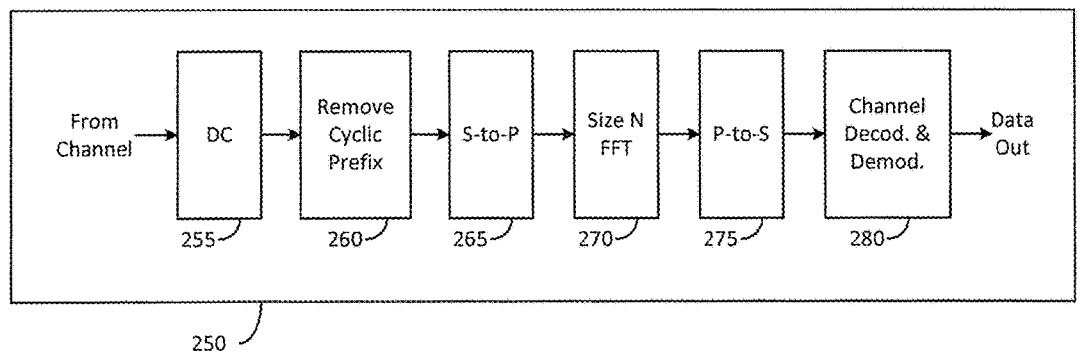

FIGS. 2A and 2B illustrate example wireless transmit and receive paths according to this disclosure. In the following description, a transmit path 200 may be described as being implemented in an eNB (such as eNB 102), while a receive path 250 may be described as being implemented in a UE (such as UE 116). However, it will be understood that the receive path 250 could be implemented in an eNB and that the transmit path 200 could be implemented in a UE. In certain embodiments, the transmit path 200 is configured to encode data using SC-LDPC codes and a zig-zag window as described in embodiments of the present disclosure. In certain embodiments, the receive path 250 is configured to decode data using SC-LDPC codes and a zig-zag window as described in embodiments of the present disclosure.

The transmit path 200 includes a channel coding and modulation block 205, a serial-to-parallel (S-to-P) block 210, a size N Inverse Fast Fourier Transform (IFFT) block 215, a parallel-to-serial (P-to-S) block 220, an add cyclic prefix block 225, and an up-converter (UC) 230. The receive path 250 includes a down-converter (DC) 255, a remove cyclic prefix block 260, a serial-to-parallel (S-to-P) block 265, a size N Fast Fourier Transform (FFT) block 270, a parallel-to-serial (P-to-S) block 275, and a channel decoding and demodulation block 280.

In the transmit path 200, the channel coding and modulation block 205 receives a set of information bits, applies coding (such as a low-density parity check (LDPC) coding), and modulates the input bits (such as with Quadrature Phase Shift Keying (QPSK) or Quadrature Amplitude Modulation (QAM)) to generate a sequence of frequency-domain modulation symbols. The serial-to-parallel block 210 converts (such as de-multiplexes) the serial modulated symbols to parallel data in order to generate N parallel symbol streams, where N is the IFFT/FFT size used in the eNB 102 and the UE 116. The size N IFFT block 215 performs an IFFT operation on the N parallel symbol streams to generate time-domain output signals. The parallel-to-serial block 220 converts (such as multiplexes) the parallel time-domain output symbols from the size N IFFT block 215 in order to generate a serial time-domain signal. The add cyclic prefix block 225 inserts a cyclic prefix to the time-domain signal. The up-converter 230 modulates (such as up-converts) the output of the add cyclic prefix block 225 to an RF frequency for transmission via a wireless channel. The signal may also be filtered at baseband before conversion to the RF frequency.

A transmitted RF signal from the eNB 102 arrives at the UE 116 after passing through the wireless channel, and reverse operations to those at the eNB 102 are performed at the UE 116. The down-converter 255 down-converts the received signal to a baseband frequency, and the remove cyclic prefix block 260 removes the cyclic prefix to generate a serial time-domain baseband signal. The serial-to-parallel block 265 converts the time-domain baseband signal to parallel time domain signals. The size N FFT block 270 performs an FFT algorithm to generate N parallel frequency-domain signals. The parallel-to-serial block 275 converts the parallel frequency-domain signals to a sequence of modulated data symbols. The channel decoding and demodulation block 280 demodulates and decodes the modulated symbols to recover the original input data stream.

Each of the eNBs 101-103 may implement a transmit path 200 that is analogous to transmitting in the downlink to UEs 111-116 and may implement a receive path 250 that is analogous to receiving in the uplink from UEs 111-116. Similarly, each of UEs 111-116 may implement a transmit path 200 for transmitting in the uplink to eNBs 101-103 and may implement a receive path 250 for receiving in the downlink from eNBs 101-103.

Each of the components in FIGS. 2A and 2B can be implemented using only hardware or using a combination of hardware and software/firmware. As a particular example, at least some of the components in FIGS. 2A and 2B may be implemented in software, while other components may be implemented by configurable hardware or a mixture of software and configurable hardware. For instance, the FFT block 270 and the IFFT block 215 may be implemented as configurable software algorithms, where the value of size N may be modified according to the implementation.

Furthermore, although described as using FFT and IFFT, this is by way of illustration only and should not be construed to limit the scope of this disclosure. Other types of transforms, such as Discrete Fourier Transform (DFT) and Inverse Discrete Fourier Transform (IDFT) functions, could be used. It will be appreciated that the value of the variable N may be any integer number (such as 1, 2, 3, 4, or the like) for DFT and IDFT functions, while the value of the variable N may be any integer number that is a power of two (such as 1, 2, 4, 8, 16, or the like) for FFT and IFFT functions.

Although FIGS. 2A and 2B illustrate examples of wireless transmit and receive paths, various changes may be made to FIGS. 2A and 2B. For example, various components in FIGS. 2A and 2B could be combined, further subdivided, or omitted and additional components could be added according to particular needs. Also, FIGS. 2A and 2B are meant to illustrate examples of the types of transmit and receive paths that could be used in a wireless network. Any other suitable architectures could be used to support wireless communications in a wireless network.

Figure 3:
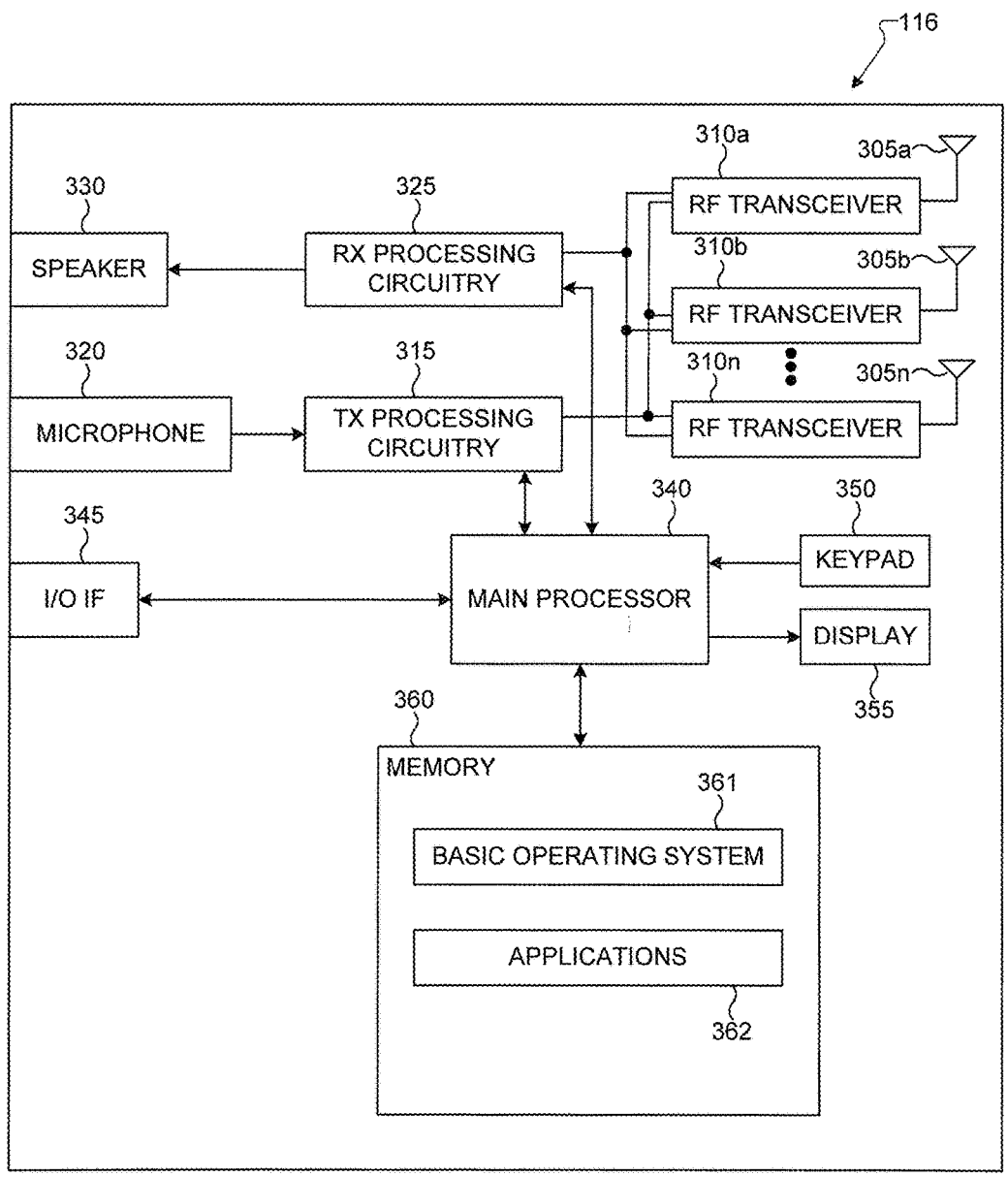
FIG. 3 illustrates an example user equipment according to this disclosure.

FIG. 3 illustrates an example UE 116 according to this disclosure. The embodiment of the UE 116 illustrated in FIG. 3 is for illustration only, and the UEs 111-115 of FIG. 1A could have the same or similar configuration. However, UEs come in a wide variety of configurations, and FIG. 3 does not limit the scope of this disclosure to any particular implementation of a UE.

The UE 116 includes multiple antennas 305a-305n, radio frequency (RF) transceivers 310a-310n, transmit (TX) processing circuitry 315, a microphone 320, and receive (RX) processing circuitry 325. The TX processing circuitry 315 and RX processing circuitry 325 are respectively coupled to each of the RF transceivers 310a-310n, for example, coupled to RF transceiver 310a, RF transceiver 210b through to a $N^{th}$ RF transceiver 310n, which are coupled respectively to antenna 305a, antenna 305b and an $N^{th}$ antenna 305n. In certain embodiments, the UE 116 includes a single antenna 305a and a single RF transceiver 310a. The UE 116 also includes a speaker 330, a main processor 340, an input/output (I/O) interface (IF) 345, a keypad 350, a display 355, and a memory 360. The memory 360 includes a basic operating system (OS) program 361 and one or more applications 362.

The RF transceivers 310a-310n receive, from respective antennas 305a-305n, an incoming RF signal transmitted by an eNB or AP of the network 100. In certain embodiments, each of the RF transceivers 310a-310n and respective antennas 305a-305n is configured for a particular frequency band or technological type. For example, a first RF transceiver 310a and antenna 305a can be configured to communicate via a near-field communication, such as BLUETOOTH®, while a second RF transceiver 310b and antenna 305b can be configured to communicate via a IEEE 802.11 communication, such as Wi-Fi, and another RF transceiver 310n and antenna 305n can be configured to communicate via cellular communication, such as 3G, 4G, 5G, LTE, LTE-A, or WiMAX. In certain embodiments, one or more of the RF transceivers 310a-310n and respective antennas 305a-305n is configured for a particular frequency band or same technological type. The RF transceivers 310a-310n down-converts the incoming RF signal to generate an intermediate frequency (IF) or baseband signal. The IF or baseband signal is sent to the RX processing circuitry 325, which generates a processed baseband signal by filtering, decoding, and/or digitizing the baseband or IF signal. The RX processing circuitry 325 transmits the processed baseband signal to the speaker 330 (such as for voice data) or to the main processor 340 for further processing (such as for web browsing data).

The TX processing circuitry 315 receives analog or digital voice data from the microphone 320 or other outgoing baseband data (such as web data, e-mail, or interactive video game data) from the main processor 340. The TX processing circuitry 315 encodes, multiplexes, and/or digitizes the outgoing baseband data to generate a processed baseband or IF signal. The RF transceivers 310a-310n receive the outgoing processed baseband or IF signal from the TX processing circuitry 315 and up-converts the baseband or IF signal to an RF signal that is transmitted via one or more of the antennas 305a-305n.

The main processor 340 can include one or more processors or other processing devices and execute the basic OS program 361 stored in the memory 360 in order to control the overall operation of the UE 116. For example, the main processor 340 could control the reception of forward channel signals and the transmission of reverse channel signals by the RF transceivers 310a-310n, the RX processing circuitry 325, and the TX processing circuitry 315 in accordance with well-known principles. In some embodiments, the main processor 340 includes at least one microprocessor or microcontroller. The main processor 340 includes processing circuitry configured to encode or decode data information, such as including a sliding window encoder with stopping function, sliding window decoder with stopping function; zigzag-window encoder; a zigzag window decoder; or a combination thereof.

The main processor 340 is also capable of executing other processes and programs resident in the memory 360, such as operations for using SC-LDPC codes and a zig-zag window as described in embodiments of the present disclosure. The main processor 340 can move data into or out of the memory 360 as required by an executing process. In some embodiments, the main processor 340 is configured to execute the applications 362 based on the OS program 361 or in response to signals received from eNBs or an operator. The main processor 340 is also coupled to the I/O interface 345, which provides the UE 116 with the ability to connect to other devices such as laptop computers and handheld computers. The I/O interface 345 is the communication path between these accessories and the main controller 340.

The main processor 340 is also coupled to the keypad 350 and the display unit 355. The user of the UE 116 can use the keypad 350 to enter data into the UE 116. The display 355 can be a liquid crystal display or other display capable of rendering text or at least limited graphics, such as from web sites, or a combination thereof.

The memory 360 is coupled to the main processor 340. Part of the memory 360 could include a random access memory (RAM), and another part of the memory 360 could include a Flash memory or other read-only memory (ROM).

Although FIG. 3 illustrates one example of UE 116, various changes may be made to FIG. 3. For example, various components in FIG. 3 could be combined, further subdivided, or omitted and additional components could be added according to particular needs. As a particular example, the main processor 340 could be divided into multiple processors, such as one or more central processing units (CPUs) and one or more graphics processing units (GPUs). Also, while FIG. 3 illustrates the UE 116 configured as a mobile telephone or smartphone, UEs could be configured to operate as other types of mobile or stationary devices.

Figure 4:
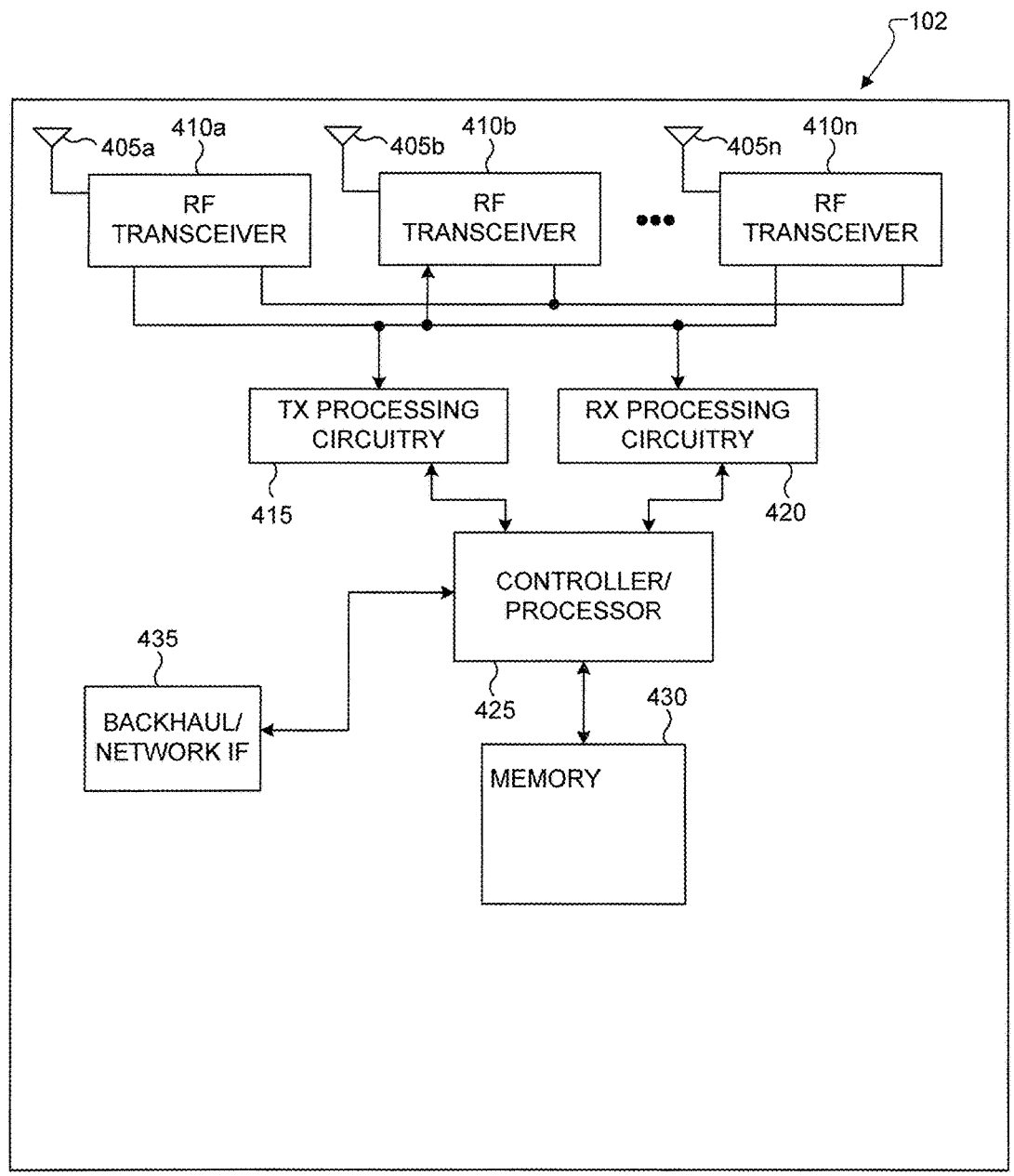
FIG. 4 illustrates an example enhanced NodeB according to this disclosure.

FIG. 4 illustrates an example eNB 102 according to this disclosure. The embodiment of the eNB 102 shown in FIG. 4 is for illustration only, and other eNBs of FIG. 1 could have the same or similar configuration. However, eNBs come in a wide variety of configurations, and FIG. 4 does not limit the scope of this disclosure to any particular implementation of an eNB.

The eNB 102 includes multiple antennas 405a-405n, multiple RF transceivers 410a-410n, transmit (TX) processing circuitry 415, and receive (RX) processing circuitry 420. The eNB 102 also includes a controller/processor 425, a memory 430, and a backhaul or network interface 435.

The RF transceivers 410a-410n receive, from the antennas 405a-405n, incoming RF signals, such as signals transmitted by UEs or other eNBs. The RF transceivers 410a-410n down-convert the incoming RF signals to generate IF or baseband signals. The IF or baseband signals are sent to the RX processing circuitry 420, which generates processed baseband signals by filtering, decoding, and/or digitizing the baseband or IF signals. The RX processing circuitry 420 transmits the processed baseband signals to the controller/processor 425 for further processing.

The TX processing circuitry 415 receives analog or digital data (such as voice data, web data, e-mail, or interactive video game data) from the controller/processor 425. The TX processing circuitry 415 encodes, multiplexes, and/or digitizes the outgoing baseband data to generate processed baseband or IF signals. The RF transceivers 410a-410n receive the outgoing processed baseband or IF signals from the TX processing circuitry 415 and up-converts the baseband or IF signals to RF signals that are transmitted via the antennas 405a-405n.

The controller/processor 425 can include one or more processors or other processing devices that control the overall operation of the eNB 102. For example, the controller/processor 425 could control the reception of forward channel signals and the transmission of reverse channel signals by the RF transceivers 410a-410n, the RX processing circuitry 420, and the TX processing circuitry 415 in accordance with well-known principles. The controller/processor 425 could support additional functions as well, such as using SC-LDPC codes and a zig-zag window as described in embodiments of the present disclosure. Any of a wide variety of other functions could be supported in the eNB 102 by the controller/processor 425. In some embodiments, the controller/processor 425 includes at least one microprocessor or microcontroller. The controller/processor 425 includes processing circuitry configured to encode or decode data information, such as including a sliding window encoder with stopping function, sliding window decoder with stopping function; zigzag-window encoder; a zigzag window decoder; or a combination thereof.

The controller/processor 425 is also capable of executing programs and other processes resident in the memory 430, such as a basic OS. The controller/processor 425 can move data into or out of the memory 430 as required by an executing process.

The controller/processor 425 is also coupled to the backhaul or network interface 435. The backhaul or network interface 435 allows the eNB 102 to communicate with other devices or systems over a backhaul connection or over a network. The interface 435 could support communications over any suitable wired or wireless connection(s). For example, when the eNB 102 is implemented as part of a cellular communication system (such as one supporting 5G, LTE, or LTE-A), the interface 435 could allow the eNB 102 to communicate with other eNBs over a wired or wireless backhaul connection. When the eNB 102 is implemented as an access point, the interface 435 could allow the eNB 102 to communicate over a wired or wireless local area network or over a wired or wireless connection to a larger network (such as the Internet). The interface 435 includes any suitable structure supporting communications over a wired or wireless connection, such as an Ethernet or RF transceiver.

The memory 430 is coupled to the controller/processor 425. Part of the memory 330 could include a RAM, and another part of the memory 430 could include a Flash memory or other ROM.

As described in more detail below, the transmit and receive paths of the eNB 102 (implemented using the RF transceivers 410a-410n, TX processing circuitry 415, and/or RX processing circuitry 420) support communication with aggregation of FDD cells and TDD cells.

Although FIG. 4 illustrates one example of an eNB 102, various changes may be made to FIG. 4. For example, the eNB 102 could include any number of each component shown in FIG. 4. As a particular example, an access point could include a number of interfaces 435, and the controller/processor 425 could support routing functions to route data between different network addresses. As another particular example, while shown as including a single instance of TX processing circuitry 415 and a single instance of RX processing circuitry 420, the eNB 102 could include multiple instances of each (such as one per RF transceiver).

LDPC codes have received a great deal of attention in recent years. This is due to their ability to achieve performance close to the Shannon limit, the ability to design codes that facilitate high parallelization in hardware, and their support of high data rates. The most commonly deployed form of the LDPC codes are the block LDPC codes. However, in highly dynamic wireless communication systems, where the channel conditions and the data allocation per user are continuously changing, block LDPC codes offer rather limited flexibility.

Using block LDPC codes requires allocating data in multiples of the code's block-length to avoid unnecessary padding, which reduces the link efficiency. Amongst the wireless standards that have adopted LDPC as a part of the specification, the following three approaches can be observed to handle the granularity limitation of block LDPC codes: 1) Use codes with one very short block-length, such as, IEEE 802.11 ad, the smaller the block length the finer the granularity of the code, however, block LDPC codes with short block lengths are lacking in performance, which also reduces the link efficiency; 2) Use block LDPC codes with multiple block lengths, such as, IEEE 802.11n, and this approach mitigates the performance degradation at the expense of implementing a more complex decoder due to the requirement to support multiple codes; and 3) Use turbo codes, such as, 3GPP. The convolutional structure of turbo codes can provide a scalable code-length with high granularity without increasing the decoder's complexity. However, turbo codes do not provide enough parallel processing capability, which in turn limits their capability to achieve multiple Giga bits per second throughput.

Spatially-coupled low-density parity-check (SC-LDPC) codes are new capacity-achieving codes. SC-LDPC codes combine the advantages of both turbo codes and LDPC block codes. SC-LDPC codes form a special class of LDPC codes that have relatively small syndrome former memory. Hence, SC-LDPC codes have parity check matrices with convolutional structure. This structure allows for scalable code-length with high granularity compared to the other block LDPC codes. In addition, SC-LDPC codes inherit the high parallel processing capabilities of LDPC codes, and are therefore capable of supporting multiple GBs throughput.

Although, it is possible to decode terminated SC-LDPC codes as any other block LDPC code, doing so diminishes the advantages of the flexible length and the fine granularity of the SC-LDPC codes. In addition, the latency and hardware complexity of this approach becomes impractical for SC-LDPC codes with very large block lengths. Due to the convolutional structure of the SC-LDPC codes parity check matrix, this decoder also requires large number of iterations before it converges. Alternatively, SC-LDPC codes can be decoded using a sliding-window decoder. This approach seems to mitigate most of the full block decoder problems. However, there are still several critical performance issues to be resolved.

First, the current SC-LDPC decoder average number of iterations is high, for example, running a sliding-window decoder on the SC-LDPC code with window size fifteen and fixed ten iterations per window execute one-hundred fifty iterations per Variable node (VN). It is required to reduce to the average number of iterations per VN in a sliding-window decoder to increase the throughput. It is also necessary to use a simple early stopping rule to terminate decoding of the current window and start decoding the next window. An early stopping rule, which estimates the bit error rate (BER) within the decoding window based on a soft-bit indicator for the VN, was proposed in REF-4. However, the evaluation of this rule requires a lookup table and the additions of $N_t$ real-numbers, where $N_t$ is the number of target variable nodes (VNs) in the decoding window. Instead, embodiments of the present disclosure propose and evaluate a simple stopping rule based on a partial syndrome computation (see, Section III).

Second, while the full block decoder utilizes both termination ends of the SC-LDPC code to improve the decoding threshold, the sliding-window decoder utilizes only the start termination end. Thus, the full block decoder outperforms the sliding-window decoder. To further close the gap between the two decoders, embodiments of the present disclosure introduce the zigzag-window decoder. Embodiments of the present disclosure also show that the zigzag-window decoder requires lesser number of iterations per VN on average than the sliding-window decoder.

Third, to adapt to the dynamic wireless channel, the coding scheme of a wireless system has to support multiple code rates. Embodiments of the present disclosure address the problem of designing an SC-LDPC code family, which supports multiple code rates. In particular, two approaches are compared in term of BER performance and decoding complexity. The first approach uses code puncturing, and the second uses code shortening. The results show that the SC-LDPC code family based on shortening has a superior error performance and converges faster than that based on puncturing.

SC-LDPC Codes: Review and Example

FIGS. 5A, 5B, 5C and 5D illustrate an example protograph-based SC-LDPC code structure. The embodiments of the SC-LDPC code structures shown in FIGS. 5A through 5D are for illustration only. Other embodiments could be used without departing from the scope of the present disclosure.

Figure 5A:
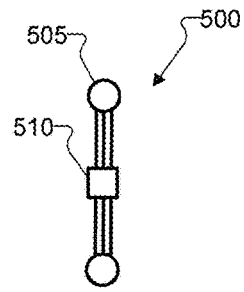
FIGS. 5A, 5B, 5C and 5D illustrate an example protograph-based SC-LDPC code structure.
Figure 5B:
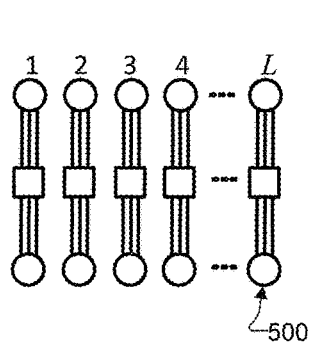
Figure 5C:
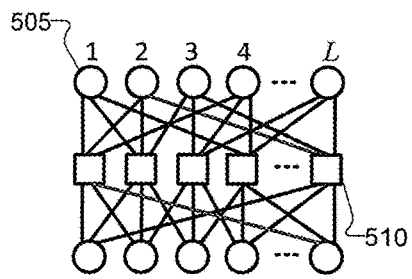
Figure 5D:
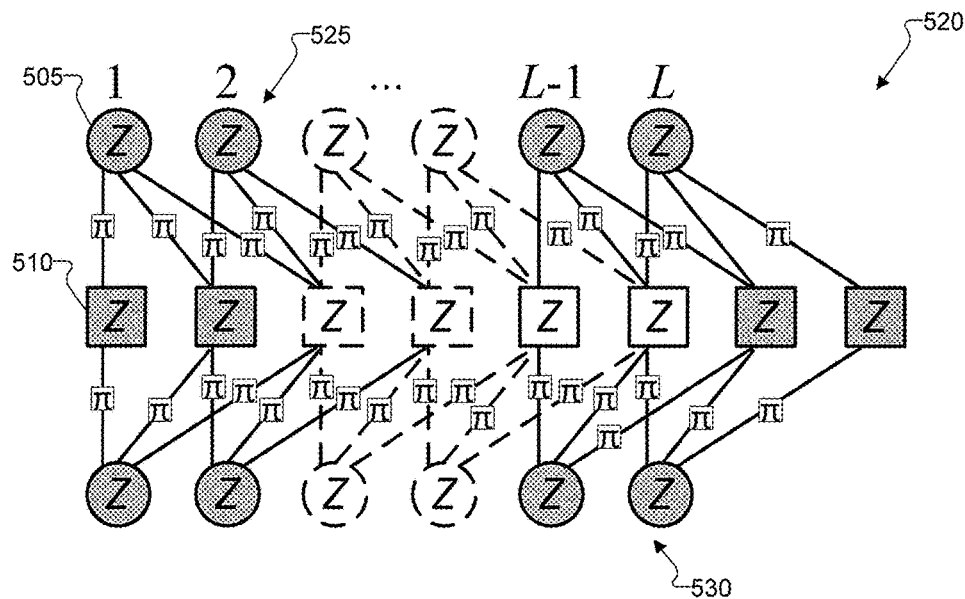

Protograph-based SC-LDPC codes starts with a protograph 500, which is a Tanner graph with relatively small number of VNs 505 and check nodes (CNs) 510. Example of a regular (3, 6) LDPC code protograph is shown in FIG. 5A. A (3, 6, L) SC-LDPC code ensemble is created using L copies of the protograph as shown in FIG. 5B. The protographs 500 are not interlinked into cycles with a VN coupled to each CN as shown in FIG. 5C. Rather, the protographs 500 are coupled into a chain 520 as shown in FIG. 5D. Each protograph 500 in the chain 520 is coupled to at most m protograph copies to its left and at most m protograph copies to its right, where m is called the syndrome former memory, or simply the code's memory. In contrast to protograph-based block LDPC codes with multiple steps lifting, SC-LDPC codes have small code's memory, namely, m<<L, which dictates the parity check matrix of the SC-LDPC codes its convolutional structure. Note that the CNs 510 in the first and last m protograph copies have lower degree than their corresponding CNS 510 in the other protograph copies. This implies a stronger CNs at the start and the end of the SC-LDPC coupled chain, and this improves the iterative decoding threshold of SC-LDPC codes at the cost of a small reduction in the code rate. The first m protograph copies in the coupled chain are called the start-termination 525, and the last m ones are called the end-termination 530, these are shown in shaded color in FIG. 5D.

Figures 6, 7:
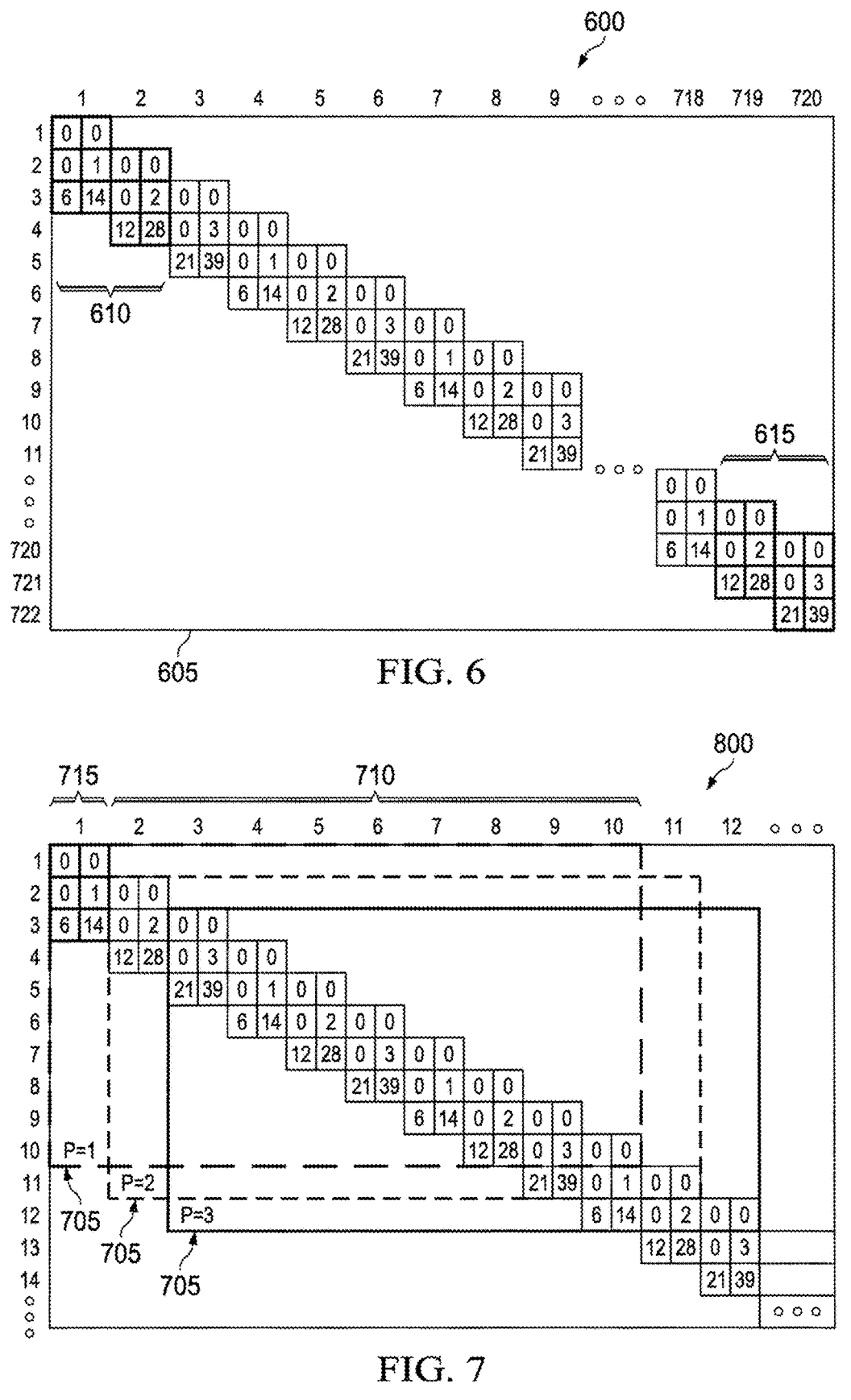

FIG. 6 illustrates an example of a (3, 6, 720) protograph-based SC-LDPC code with lifting factor Z=112 according to this disclosure. The embodiment of the protograph-based SC-LDPC code shown in FIG. 6 is for illustration only. Other embodiments could be used without departing from the scope of the present disclosure.

For example, a (3, 6, 720) SC-LDPC code 600 is designed using the protograph shown in FIG. 5A. First the code ensemble is constructed by coupling a chain 520 of seven-hundred-twenty protograph copies as in FIG. 5D, then the code is constructed by lifting the coupled chain with a lifting factor Z=112. The parity check matrix 605 for the designed SC-LDPC code 600 is shown in FIG. 6. A number x in parity check matrix 605 indicates the Z×Z identity matrix cyclically shifted x positions to the right. The blank entries in the parity check matrix 605 are the Z×Z all-zeroes matrices. Each two columns of the parity check matrix are labeled by a number, which indicates a protograph section to which these 2Z VNs belong. In each protograph section, the first Z VNs are information bits and the second Z VNs are parity bits. The designed SC-LDPC code 600 is a time-variant quasi-cyclic (QC) SC-LDPC code with periodicity equals three. The permutations matrices in this parity check matrix were chosen to maximize the girth of the first nine protograph sections. Because the periodicity of this code is three, the girth of the full code is the same as the girth of the first nine protograph sections.

Typically, SC-LDPC code parity check matrices have irregularities at the beginning and at the end that results from assumptions that entries prior to the start are zero and entries after the end are zero. The parity check matrix 600 includes a start termination 610 at the beginning and an end termination 615. This SC-LDPC code 600 will be used in generating the performance results in the next two sections.

FIG. 7 illustrates a sliding-window decoder 700 according to this disclosure. The embodiment of the sliding-window decoder 700 shown in FIG. 7 is for illustration only. Other embodiments could be used without departing from the scope of the present disclosure.

Although the SC-LDPC code 600 can be decoded as a block LDPC code, this is generally impractical if SC-LDPC codewords of very large lengths are used. Also, using a block decoder demolishes the advantages of flexible length and fine granularity of SC-LDPC codes. Certain systems use a sliding-window decoder to decode SC-LDPC codes. The sliding-window decoder is depicted in FIG. 7. The decoder process VNs in a window 705, which is defined by a number of protograph sections, W, for example, size W 710. The decoder runs a maximum number of iterations, or stops if an early termination criterion is met. After that, the decoder decides on the value of first protograph section (or, first S sections), then advances by a step, S 715, the decoding window by outputting the first protograph section (or, first S sections) and inputting the protograph section (or S sections) after the last one in the decoding window.

In the sliding-window decoder 700, a decoding window 705 of size W 710 moves along the protograph sections of the SC-LDPC code 600. The position, p, of the decoding window 705 refers to the corresponding protograph section in the window 705. The sliding-window decoder 700 runs as follows: an iterative decoding algorithm is performed when the decoding window 705 is in the first position, P=1; then the iterative decoding algorithm is performed when the decoding window 705 is in the second position, P=2; then the iterative decoding algorithm is performed when the decoding window 705 is in the third position, P=3; and so forth.

In certain system, the decoding window is stopped after a fixed number of iterations (no stopping rule), or they use an estimated bit-error-rate metric, which requires the computation of soft bit error indicators for VNs. To reduce the average number of iterations (reduce the decoding power consumption), one has to implement early stopping rule. However, the stopping rule in other systems is complex to compute.

The use of a pre-determined number of iterations is not very efficient, that as it has to be set for the worst channel condition. Instead, a real-time early stopping rule that is based on estimating the bit error rate (BER) has been proposed using the log-likelihood-ratios (LLRs) of the target VNs within a decoding window. When the estimated BER is less than a threshold BER or the maximum number of iterations reached, the decoding window 705 moves forward. The BER is estimated by averaging soft bit error indicators of the target VNs, where the soft bit error indicator for a VN having LLR $\Gamma$ is $1/(1+\exp(|\Gamma|))$. However, the evaluation of the soft bit error indicator requires a lookup table, and computing the average requires $N_t$, for example, $N_t=2Z \cdot s$ real-valued additions after each iteration.

Figures 8, 9:
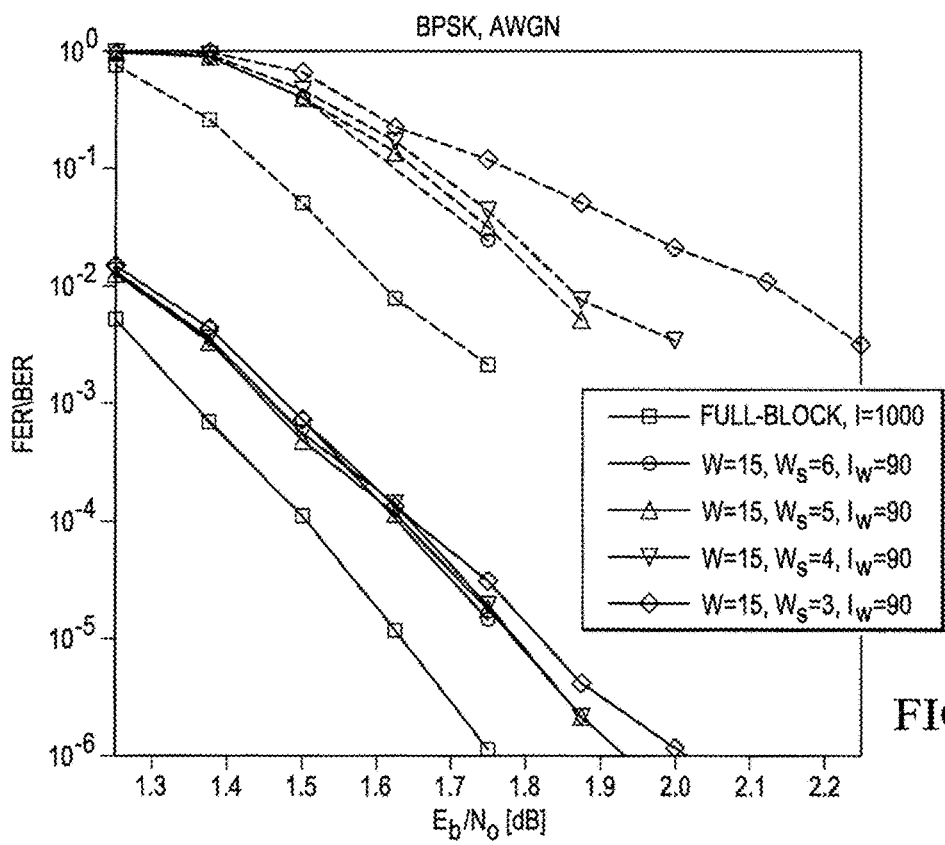
FIG. 8 illustrates a sliding-window decoder 800 with an early stopping rule according to this disclosure.
FIG. 9 shows the BER and frame error rate (FER) performance of this stopping rule according to this disclosure.

FIG. 8 illustrates a sliding-window decoder 800 with an early stopping rule according to this disclosure. The embodiment of the sliding-window decoder 800 shown in FIG. 8 is for illustration only. The sliding-window decoder 800 can be the same as the sliding-window decoder 700, but also including a stopping rule. Other embodiments could be used without departing from the scope of the present disclosure. The sliding-window decoder 800 includes a decoding window 705 of size W=10 and partial syndrome-check window 810 of size $W_s=5$.

Embodiments of the present disclosure use a simple stopping rule based on checking only part of the code's syndrome, which is related to only few of the CNs in the decoding window. Herein, $W_s$ is defined as the partial syndrome-check window width 810 (in number of protograph sections) as shown in FIG. 8. The proposed stopping rule: Check syndrome for the CNs in $W_s$, if syndrome-check passes or maximum number of iterations is reached, then the decision for the VNs in S is outputted, and after that the location of the sliding window is updated.

Embodiments of the present disclosure propose to use a simple stopping rule based on checking the syndrome of only few of the CNs in the decoding window 705. In such embodiments, a partial syndrome-check window 810 of size $W_s$ is defined as the first $W_s$ protograph sections in the decoding window 705. In the sliding-window decoder 800, a decoding window 705 of size W moves along the protograph sections of the SC-LDPC code 600. The position, $p_i$, of the decoding window refers to the first protograph section in the window. The updated sliding-window decoder 800 is as follows:

For all window positions $p_i=p_{i-1}+s$, where s is the window step size, i=1, . . . , L, and $p_1=1$:
1) For a maximum number of 4, iterations:
   Update all VNs and CNs in the decoding window 805 according to an iterative LDPC code decoding algorithm.
   Compute the syndrome for the CNs in the partial syndrome-check window. If all CNs are satisfied or maximum number of iterations reached, go to the next step. Otherwise, continue the next iteration.
2) Make a decision on the value of the target VNs. The VNs in the first S sections of the decoding window are called target VNs.

Within the decoding window 705, one can use any of the iterative decoding algorithms used for LDPC codes such as sum-product, min-sum, dual-quantization domain, and so forth. It is also noted that updating the CNs within the decoding window 705 requires access to extrinsic information for VNs outside the decoding window. In particular, the VNs in the m protograph sections just before the decoding window 705. These VNs send their extrinsic information based on the last update from the previous window. The maximum number of iterations can be chosen to achieve targeted error probability within the window. This can be done using density evolution techniques.

FIG. 9 shows the BER and frame error rate (FER) performance of this stopping rule using the sliding window decoder 800 with W=15, s=1, and $I_w=90$ and with different partial syndrome-check window size $W_s=5$, $W_s=4$, and $W_s=3$. The results also compared to that using the full block decoder with one-thousand iteration maximum. It is noticeable that the FER performance of the sliding window decoder starts to degrade for $W_s<5$. The results for $W_s>5$ appear to have similar performance to $W_s=5$. It is noted that $W_s$ for this code should be greater than or equal 3, as the CNs in this window 705 are directly connected to the target VNs.

Zigzag-Window Decoder

Figure 10A:
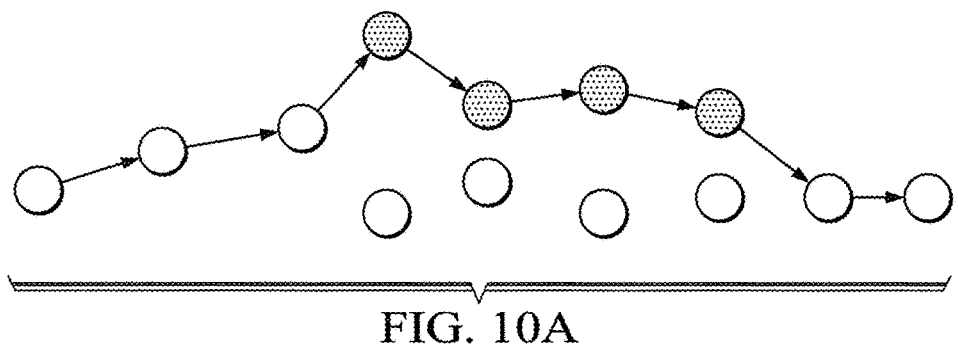
FIGS. 10A and 10B illustrate zigzag-window decoder states according to this disclosure.
Figure 10B:
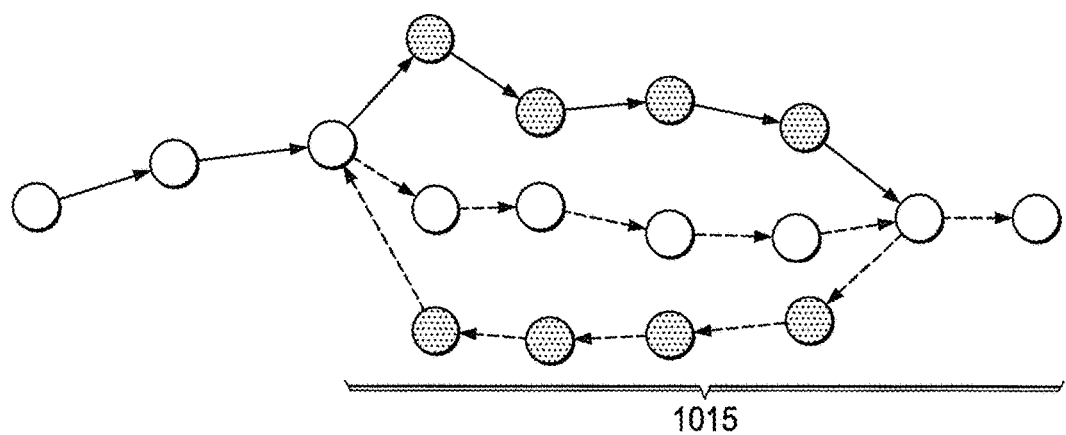

FIGS. 10A and 10B illustrate zigzag-window decoder states according to this disclosure. The embodiments of the zigzag-window decoder states are for illustration only. Other embodiments could be used without departing from the scope of the present disclosure.

In the sliding-window decoder 800 the window moves in one direction from the start-termination 610 toward the end-termination 615. This allows the information to flow between decoding windows 705 in one direction only, which results in some loss in performance compared to the full block decoder. Moreover, simulations using sliding-window decoder 800 showed that when a decoding window fails to converge, that is, the maximum number of iterations is reached and the CNs in the partial syndrome-check window 805 are not satisfied, few successive decoding window will also diverge, but after that, the sliding-window decoder 800 will converge back to the correct decision. This is illustrated in FIG. 10A, where the circles represent the state of the decoding windows as the sliding-window decoder 800 moves along the protograph sections of the SC-LDPC code 600. A white circle 1005 indicates that the decoding window converged to the correct decision, and the grey circle 1010 indicates that the decoding window did not converge. Herein, a divergence is defined as the set of consecutive protograph sections that fail to converge, and a divergence size is defined as the number of protograph sections within the divergence. For example, the divergence in FIG. 10A has size of four.

Figure 10C:
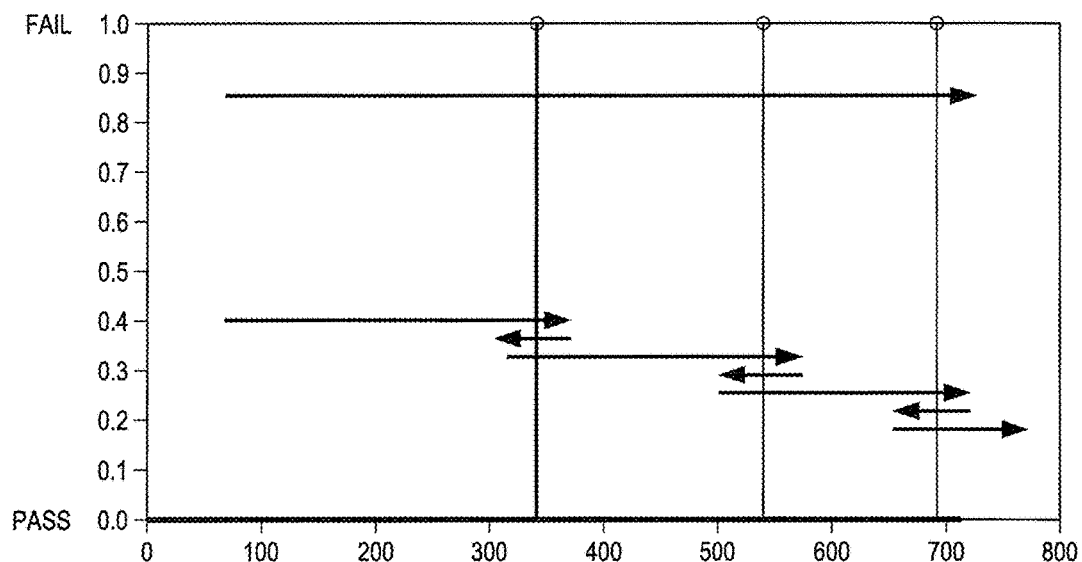
FIGS. 10C and 10D illustrate a decoding window schedule for the proposed zigzag-window decoder according to this disclosure.
Figure 10D:
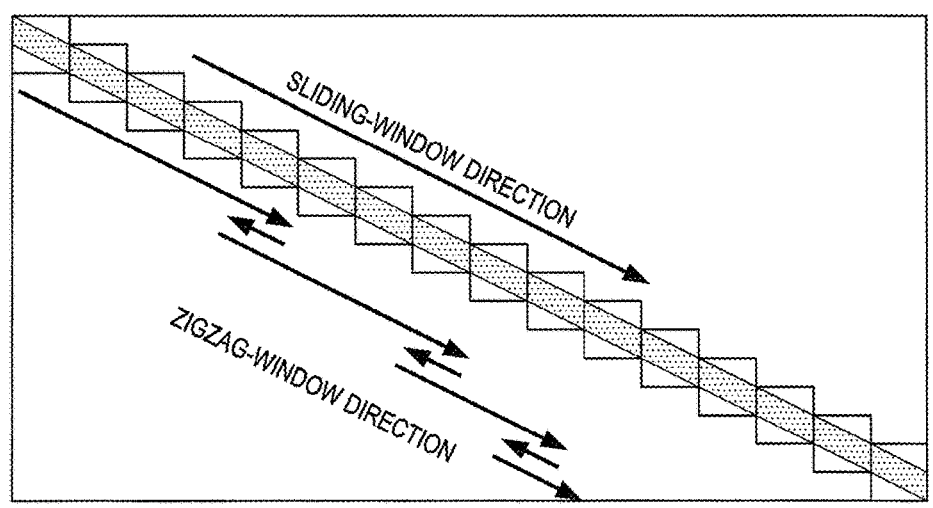
Figure 10E:
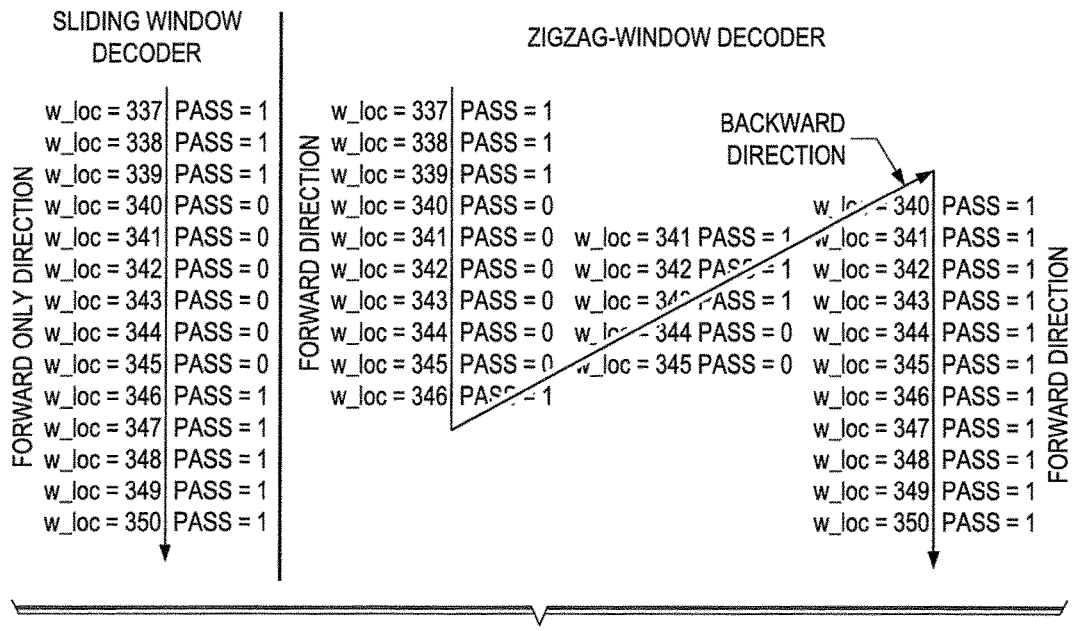
FIG. 10E illustrates an example comparing the proposed zigzag-window decoder to the sliding-window decoder according to this disclosure.

Certain embodiments provide a new decoder called the Zigzag-window decoder. In the zigzag-window decoder, the decoding window has two directions as shown in FIGS. 10C, 10D and 10E.

Forward direction: If the early stopping rule is met or the maximum number of iterations reached, the decoding window advances one protograph section (or, SW sections) to the right pushing information from left to right. If the early stopping criterion met, the targeted protograph section(s) is set to pass decoding. Otherwise, it is set to fail decoding. The consecutive protograph sections that fail decoding are called divergence.

Backward direction: At the end of a divergence, the decoding window changes its direction pushing information from right to left. This direction continues until the decoding window reaches the start of the divergence, then switch to the forward direction.

In the zigzag-window decoder, at the end of a divergence the decoding window reverses its direction trying to correct the divergence by pushing the information from the correct state at the end of the divergence back to the divergence. FIG. 10B illustrates the direction of the zigzag-window decoder. The decoding window has two directions: Forward direction, in which the decoding window moves away from the start-termination toward the end-termination (right), and a backward direction, in which the decoding window moves away from the end-termination toward the start-termination (left). The zigzag-window decoder process is as follows:
1) Set window position p=1, window direction=Forward, and previous_window_converged=True.
2) For a maximum number of $I_w$ iterations:
   Update all VNs and CNs in the decoding window according to an iterative LDPC code decoding algorithm.
   Compute the syndrome for the CNs in the partial syndrome-check window.
      If all CNs are satisfied, set window_converged=True, then go to Step 3.
      Else if the maximum number of iterations reached, set window_converged=False, then go to Step 3.
3) Check the decoding window direction If window_direction = Forward,
   If window_converged = False, and
      previous_window_converged = True, -continued

```
        divergence_start_position = p.
    Else if window_converged = True,
        previous_window_converged = False, and the
        number of Z-rounds is less than the maximum
        number of Z-rounds,
            divergence_end_position = p.
            window_direction = Backward.
            p = p − 2s.
    If window_converged = True,
        Make a decision on the value of the target VNs.
    previous_window_converged = window_converged .
    p=p+s.
    Else if window_ direction = Backward,
        (a)    If p>divergence_start_position
            p=p−s.
        (b)    Else
            p=p+s.
            window_direction = Forward.
            previous_window_converged = True.
    If p<L, then Go to Step 2. Else, Stop.
```

Figure 11A:
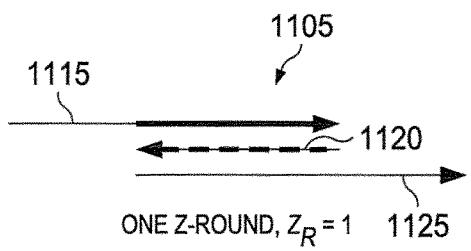
FIGS. 11A and 11B illustrate examples of one Z-round and two Z-rounds of the zigzag-window decoder according to this disclosure.
Figure 11B:
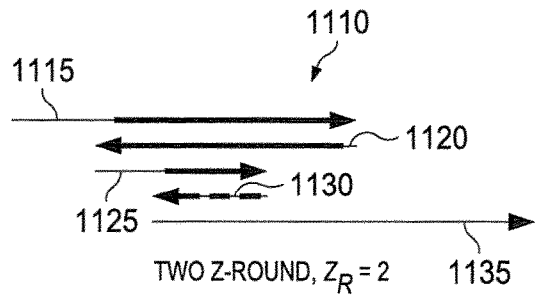

In the proposed zigzag-window decoder, a Z-round is defined as the combination of a forward, a backward, and then a forward window direction upon the occurrence of a divergence. In certain embodiments, when some of protograph sections in the divergence have not converged while in the second forward window direction of the Z-round, then a second Z-round is nested within the first Z-round. An illustration of this concept is shown in FIGS. 11A and 11B. FIG. 11A illustrates a one Z-round 1105 having forward 1115, a backward 1120, and then a forward 1125 window direction upon the occurrence of a divergence. FIG. 11B illustrates a one Z-round 1110 having forward 1115, a backward 1120, a second forward 1125, a second backward 1130 and a then a third forward 1135 window direction upon the occurrence of a divergence. Similarly multiple Z-rounds can be performed. However, to prevent unlimited bouncing within a set of VNs at the low SNR region a maximum number of Z-rounds should be specified.

Practical implementation of the zigzag-window decoder supports a pre-determined max. divergence size called Z-window 1015. The Z-window 1015 is maximum supported divergence size. In certain embodiments, implementation memory is proportional to $W+Z_w+m$. If Divergence size>Z-window, the zigzag-window decoder terminates codeword decoding and requests retransmission.

Figure 12A:
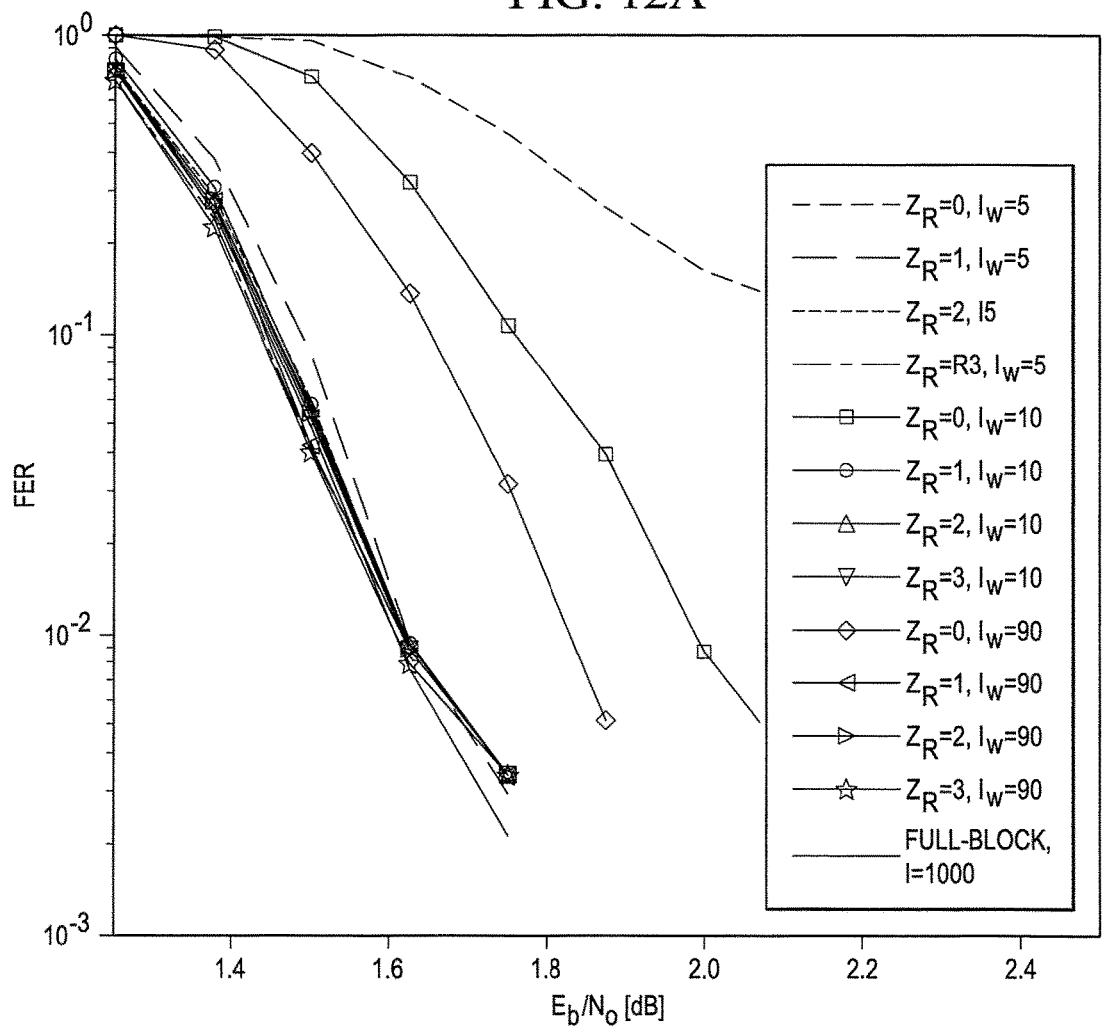

FIGS. 12A and 12B illustrate performances of respective zigzag-window decoders according to this disclosure. FIG. 12A illustrates the performance of the zigzag-window decoder for One Z-round, $Z_R=1$ and FIG. 12B illustrates the performance of the zigzag-window decoder for Two Z-rounds, $Z_R=2$. The performances shown in FIGS. 12A and 12B are for illustration only. Other illustrations and data could be used without departing from the scope of the present disclosure.

FIGS. 12A and 12B show the performance of the zigzag-window decoder for different maximum number of Z-rounds, $Z_R$, and different maximum number of iterations, L. The simulation is done using BPSK modulation over the AWGN channel, and the decoder used within the decoding window is the scaled min-sum with flooding scheduling. The zigzag-window decoder with $Z_R=0$ is the sliding-window decoder. Note, the zigzag-window decoder allows the information to flow from the end of the divergence backward. Accordingly, the BER/FER performance of the zigzag-window decoder is better than the sliding window decoder. Also, the zigzag-window decoder allows using a small value for the maximum number of iterations compared to the sliding-window decoder without degrading the BER performance. It is noted that the zigzag-window decoder with $Z_R=1$ and $I_w=5$ is 0.25 decibels (dB) better than the sliding-window decoder with $I_w=90$. Moreover, FIG. 12B shows that the zigzag-window decoder with $Z_R=1$ and $I_w=5$ requires less number of iteration per VN on average than the sliding-window decoder with $I_w=90$. Finally, FIGS. 12A and 12B show that increasing the number of Z-rounds beyond $Z_R=1$ has a diminishing return.

The results in FIGS. 12A and 12B assume no limitations on the divergence size. However, a realizable implementation of the zigzag-window decoder has to specify the maximum divergence size. It is noted that the memory needed to implement the zigzag-window decoder increases when increasing the supported maximum divergence size. The maximum divergence size is called the Z-window size, $Z_W$. The needed implementation memory is proportional to $W+Z_W+m$.

In certain embodiments, any of the decoding algorithms used in decoding block LDPC codes can be used for updating the VNs and CNs within the decoding window. Some of the commonly used decoders are product-sum, scaled min-sum (SMS), and dual-quantization domain (DQD). The algorithm within the decoding window can run a flooding or layered scheduling. Also, the processing of the CNs and VNs within the window can be done in parallel or serially.

Recall that SC-LDPC codes have finite code's memory, which is defined as follows: the SC-LDPC code has memory m if the values of the bits in any given protograph section depend on the values of the bits in at most m protograph sections before or after this protograph section. For SC-LDPC codes m is typically small number, for example in FIG. 6, the SC-LDPC code 600 memory m=2.

This property of SC-LDPC codes can be utilized to increase the parallel factor of a layered decoding machine working on a window W of the SC-LDPC. It is noted that the parallel factor for LDPC codes in general is Z, however the structure of the SC-LDPC code 600 allows parallel factor higher than Z.

In certain embodiments, a memory m SC-LDPC code, which is constructed using Z×Z circulant matrices, and which is decoded with a decoding window of size W in a layered scheduling. It is possible to process Z*floor(W/(m+ 1)) CNs in parallel contention free (No two CNs needs to access the same VN memory at the same time).

As an example, the SC-LDPC code 600 with zigzag-window decoder (or, sliding-window decoder) of W=15 requires in typical layered decoder 15 layers per iteration (each layer process Z=112 CNs). However, according to the above embodiment it is possible to finish the iteration in 3 layers. In the first layer process the 112*5 CNs in rows 1, 4, 7, 10, and 13 of the decoding window. In the second layer process the 112*5 CNs in rows 2, 5, 8, 11, and 14 of the decoding window. In the third layer process the 112*5 CNs in rows 3, 6, 9, 12, and 15 of the decoding window.

Figure 13:
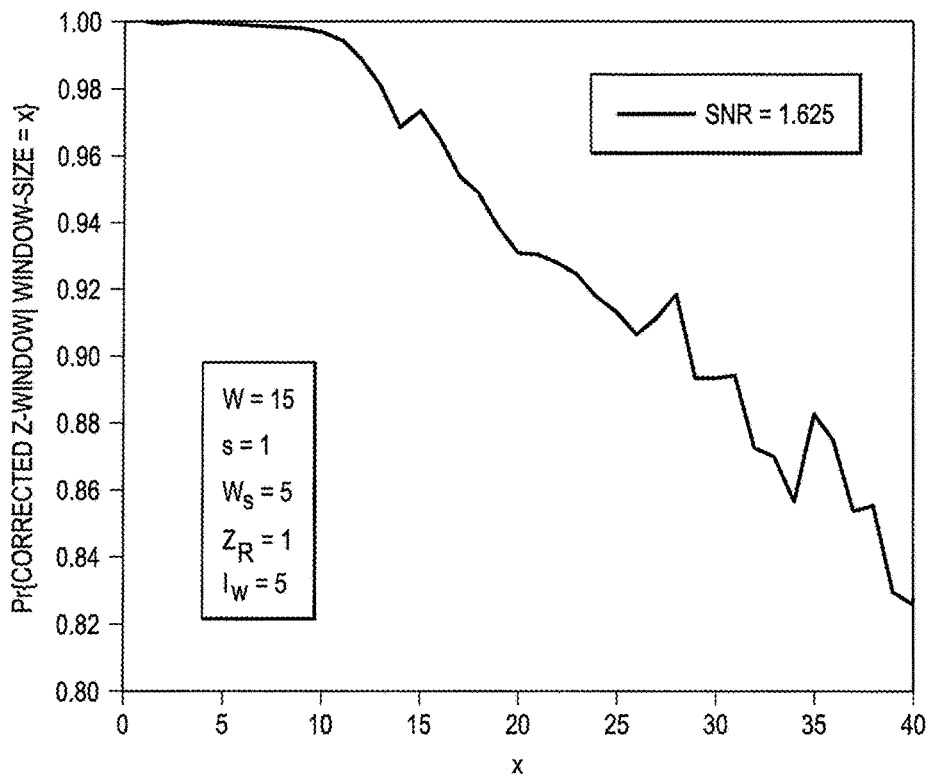
FIG. 13 illustrates a probability of correcting a divergence of size x protograph sections with one Z-round of the zigzag-window decoder according to this disclosure.
Figure 14:
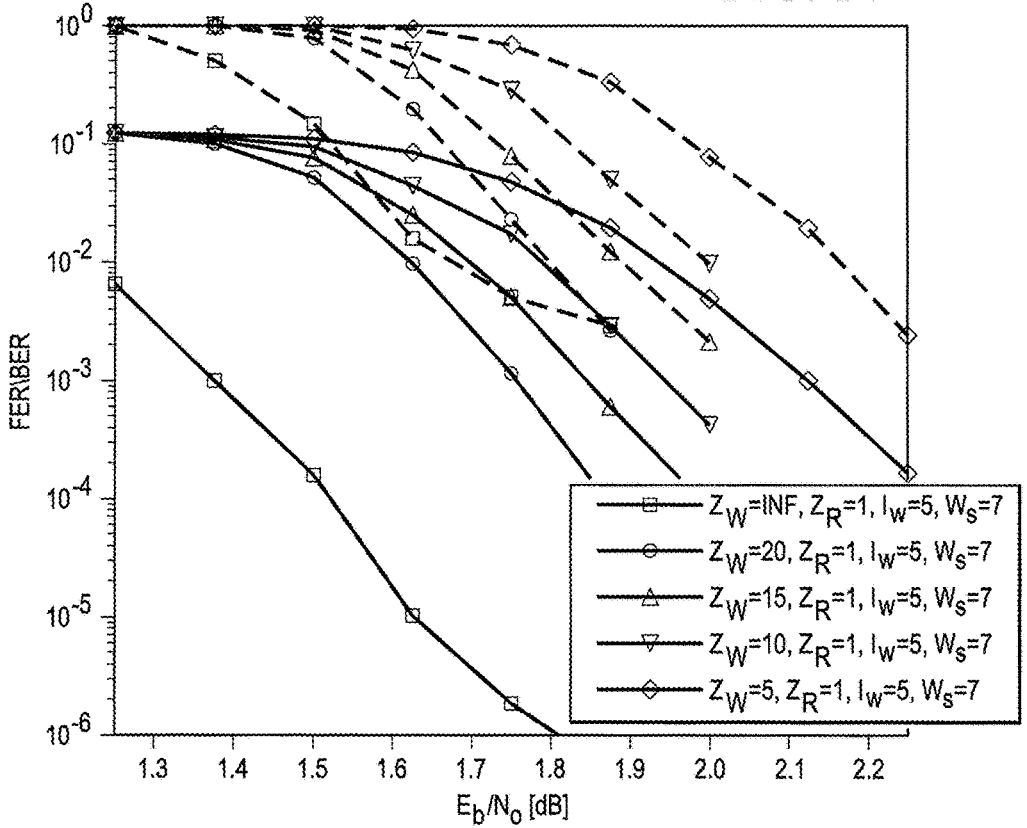
FIG. 14 illustrates FER (dashed) and BER (solid) performance of the zigzag-window decoder with different Z-window size according to this disclosure.
Figure 15:
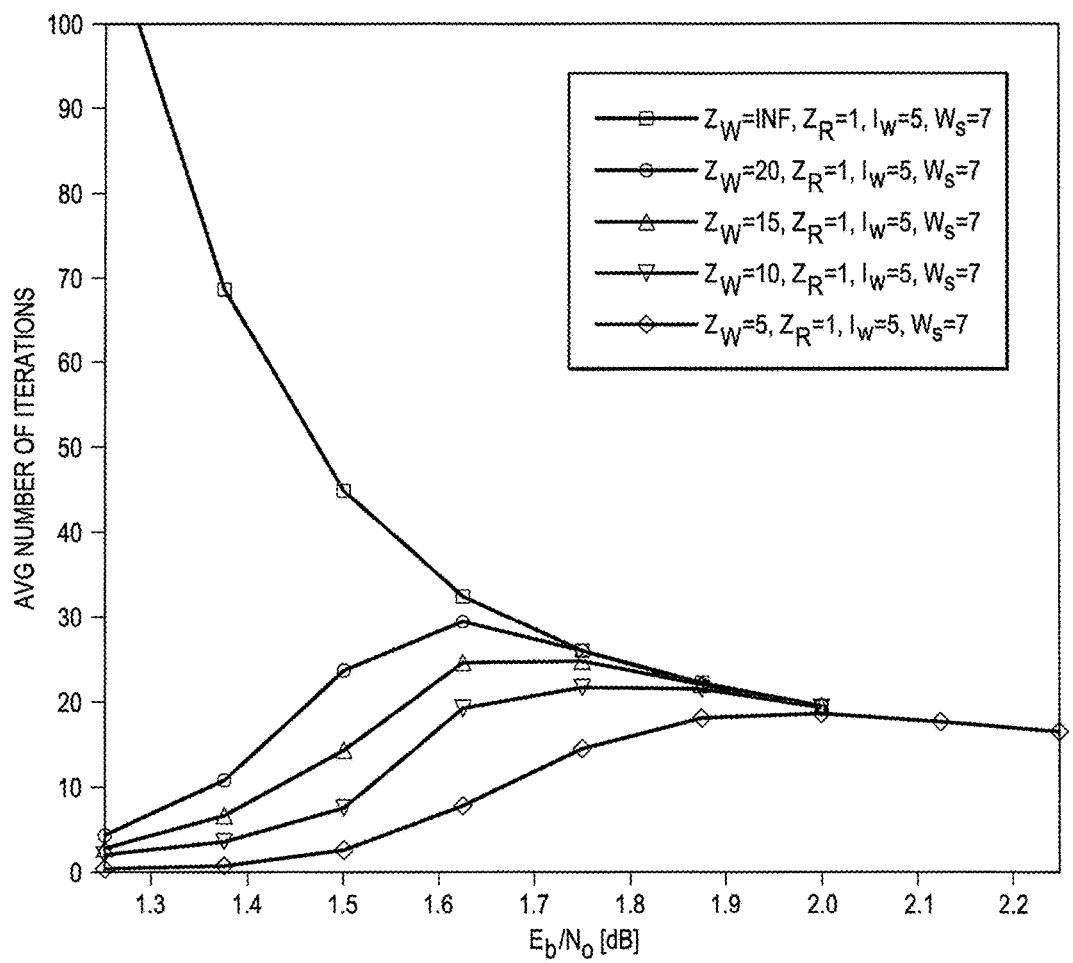
FIG. 15 illustrates an average number of iterations performance of the zigzag-window decoder applying the early codeword-failure detection rule with different Z-window size according to this disclosure.

FIG. 13 illustrates a probability of correcting a divergence of size x protograph sections with one Z-round of the zigzag-window decoder according to this disclosure. FIG. 14 illustrates FER (dashed) and BER (solid) performance of the zigzag-window decoder with different Z-window size according to this disclosure. The examples shown in FIGS. 13 and 14 are for illustration only. Other illustrations and data could be used without departing from the scope of the present disclosure.

FIG. 13 shows that the probability of correcting a divergence decreases with its size. FIG. 14 shows the performance of the zigzag-window decoder for different Z-window sizes ($Z_W$=5, 10, 15, 20, and infinity). The results show that increasing the Z-window size improves the performance, but requires more implementation memory. Future study is needed to the optimize the choice of $Z_W$ and $I_w$. For example, it is possible to reduce $Z_W$ and increase $I_w$ to maintain the performance.

In certain embodiments, a zigzag-window decoder incorporates a codeword-failure detection rule. The zigzag-window decoder with a finite Z-window size, $Z_W$, observing a divergence of size greater than $Z_W$ is used as an early indication of block decoding failure. In this case, the zigzag-window decoder may stop decoding the remainder of the SC-LDPC codeword, then the receiver can request a retransmission of the SC-LDPC codeword from the transmitter. This early codeword-failure detection rule reduces the average number of iterations especially at low SNR, see for example, FIG. 15, and this reduces the decoder's power consumption. Also, the early codeword-failure detection rule allows the receiver to quickly request retransmission via automatic repeat request (ARQ), or hybrid ARQ (HARQ), which reduces the latency of the feedback error correction scheme.

Rate-1/2 Protograph-Based SC-LDPC Code Design:

FIG. 16 illustrates a (3, 6) protograph-based SC-LDPC code according to this disclosure. The embodiment of the (3, 6) protograph-based SC-LDPC code 1600 shown in FIG. 16 is for illustration only. Other embodiments could be used without departing from the scope of the present disclosure.

In embodiments of the present disclosure are described with reference to the SC-LDPC code 1600, which can be the same as, or similar to, the SC-LDPC code 600 in FIG. 6 with "ZZ" values in place of blanks for all-zero matrices. The SC-LDPC code 1600 or the SC-LDPC code 600 are used as examples throughout the invention. However, the embodiments of this disclosure are not limited to this example and can be applied to any SC-LDPC code.

The SC-LDPC code 1600 is constructed from several copies of a (3,6)-regular protograph. The lifting factor is Z=112, and so the matrix in FIG. 16 shows the IDs for the circulant permutation matrices, which construct the SC-LDPC code 1600. In the example shown in FIG. 16, A(1), A(2), . . . , and A(18) have the values 0, 0, 0, 0, 0, 0, 0, 1, 0, 2, 0, 3, 6, 14, 12, 28, 21, and 39, respectively. It is noted that the circulant permutation matrix with ID 0 is the Z×Z identity matrix. Also, the circulant permutation matrix with ID i is the Z×Z identity matrix cyclically shifted i position to the right. Further in the example shown in FIG. 16, ZZ refers to the Z×Z all-zero matrix. The rows of this matrix correspond to the check nodes (CNs) and the columns correspond to the variable nodes (VNs).

Each of the two columns of circulant permutations are labeled by a number, which indicates the protograph section to which these 2Z VNs belong. In each protograph section, the first Z VNs represents the information bits and the second Z VNs represents the parity bits. It is also possible to have the first Z VNs to represents the parity bits and the second Z VNs to represent the information bits. Though FIG. 16 shows 720 protograph sections, the length of this SC-LDPC code 1600 can varies depends on the amount of information bits available and which need to be encoded in one codeword. In general the length of the codeword (CW) is ceil(# of information bits/Z)*Z/R, where R is the code rate (R=1/2 in this example). It is important to note the small granularity of this code (granularity=Z information bits), and the CW-length flexibility, this makes protograph-based SC-LDPC codes attractive for adoption in wireless communication standardization. Protograph-based SC-LDPC codes have small granularity and CW-length flexibility of convolutional/turbo codes, and protograph-based SC-LDPC codes have high parallelization factor of LDPC codes needed in high throughput systems.

Also note that only eighteen circulant permutations are used to construct the SC-LDPC code 1600, which are repeated as the CW-length increases. For example, the circulant permutations used in protograph in section 1 1605 are re-used in protograph section 4 1620, section 7 1635, section 10, . . . , and the circulant permutations used in protograph other embodiments in section 2 1610 are re-used in protograph section 5 1625, section 8 1640, section 11, . . . , and the protograph sections used in protograph section 3 1615 are used in section 6 1630, section 9 1645, section 12, . . . and so forth.

Puncturing the Designed Rate-1/2 SC-LDPC to Get Higher Rates:

FIG. 17 illustrates a rate-1/2 protograph-based SC-LDPC code punctured to rate-3/4 using a puncturing pattern according to this disclosure. The embodiment of the SC-LDPC code 1700 shown in FIG. 17 is for illustration only. Other embodiments could be used without departing from the scope of the present disclosure.

Protograph based codes can be punctured to obtain codes with higher rate. For example the SC-LDPC code 1600 has rate-1/2, but the SC-LDPC code 1600 can be punctured: to rate-2/3 using the puncturing pattern [1, 0; 1 1,]; to rate-3/4 using the puncturing pattern [1, 0, 1; 1, 1, 0]; or to rate-5/6 using the puncturing pattern [1, 0, 1, 0, 1; 1, 1, 0, 1 0,]. Though these patterns looks similar to the ones commonly used for puncturing convolutional codes, here the puncturing pattern applies for the protograph sections. For example, the puncturing pattern [1, 0, 1; 1, 1, 0] is applied to every three consecutive protograph sections of the SC-LDPC code 1600. The values before the semicolon indicate wither to transmit or puncture the Z information bits of each protograph section. The values after the semicolon indicate wither to transmit (value '1') or puncture (value '0') the Z parity bits of each section.

Termination of Protograph-Based SC-LDPC Codes:

In general, the SC-LDPC codes gain over block LDPC codes comes from the termination of the SC-LDPC codes. This termination is typically represented by the low degree CNs at the edges of the code's graph. For example, in the SC-LDPC code 1600 in FIG. 16 all CNs have degree six, except the CNs in the protograph sections 1, 2, 721, and 722 (CNs in sections 1 and 722 have degree two, and CNs in protograph sections 2 and 721 have degree four). In another point of view, the SC-LDPC code 1600 in FIG. 16 can be viewed as a section from infinitely long code, but with the information and parity bits in protograph sections 0, −1, −2, . . . , and 721, 722, 723, . . . have the value '0'.

In certain embodiments, an SC-LDPC code, such as SC-LDPC code 1600, can be viewed as a section from infinitely long SC-LDPC code, but with the information and parity bits in the protograph sections before the start-termination protograph sections and after the end-termination protograph sections have fixed (or surly know pattern). For example, in the SC-LDPC code 1600 the bit in the protograph sections 0, −1, −2, . . . , and 721, 722, 723, . . . have fixed and known values. It is noted that the codewords of the SC-LDPC codes depend on the used fixed pattern. Changing these fixed values changes the codewords of the code (changes the code).

In certain embodiments, the SC-LDPC codeword changes by changing the termination bits in the divider protograph sections. These bits can be encrypted and sent to the receiver over a secure link. In certain embodiments, these bits are used to initialize the SC-LDPC decoder to be able to decode the received SC-LDPC codeword.

It is noted that SC-LDPC codes have finite code's memory (namely syndrome former memory), which is defined as follows: the SC-LDPC code has memory m if the values of the bits in any given protograph section depend on the values of the bits in at most m protograph sections before or after this protograph section. In the SC-LDPC code 1600 in FIG. 16, the code's memory m=2.

Figure 18:
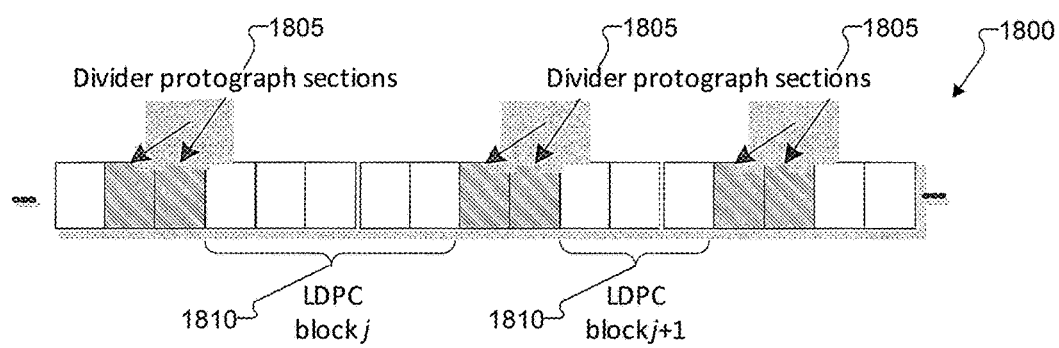
FIG. 18 illustrates an infinitely long SC-LDPC code divided into several block LDPC codes using divider protograph sections according to this disclosure.

FIG. 18 illustrates an infinitely long SC-LDPC code divided into several block LDPC codes using divider protograph sections according to this disclosure. The embodiment of the divided SC-LDPC code 1800 shown in FIG. 18 is for illustration only. Other embodiments could be used without departing from the scope of the present disclosure.

In certain embodiments, an SC-LDPC code with memory m is viewed as a section from infinitely long SC-LDPC code, but the information and parity bits in the m protograph sections before the start-termination protograph sections and after the end-termination protograph sections have a fixed or positively know pattern. For example, the SC-LDPC code 1600 in FIG. 16 the bits in the protograph sections 0, −1, 721, and 722 have fixed and known values. This is true regardless of the values of the bits in the protograph sections before −1 and after 722. Any m consecutive protograph sections with known bit values are referenced as divider protograph sections 1805. It is noted that the protograph sections of an SC-LDPC code between two divider protograph sections 1805 form a block LDPC code 1810. Unlike typical block LDPC codes, this divided SC-LDPC code 1800 can be decoded using the SC-LDPC decoder jointly with the protograph sections before and after the divider protograph sections 1805. It is noted that, in the example shown in FIG. 18, the lengths of the LDPC blocks 1810 do not have to be equal.

It is also noted that, using the value '0' (or a known fixed pattern) in the divider protograph sections 1805 reduces the rate of the code.

In certain embodiments, instead of using a known fixed pattern in the divider protograph sections, the divider section 1805 can carry information and parity bits, which can be checked for correctness using some method. As an example, the transmitted packets generally carry cyclic redundancy check (CRC) to check for packet correctness. If the bits in m consecutive protograph sections, which are part of a CRC codeword, pass the CRC check, then these bits can be treated as a known fixed pattern of bits, in other words, divider protograph sections 1805.

Figure 19:
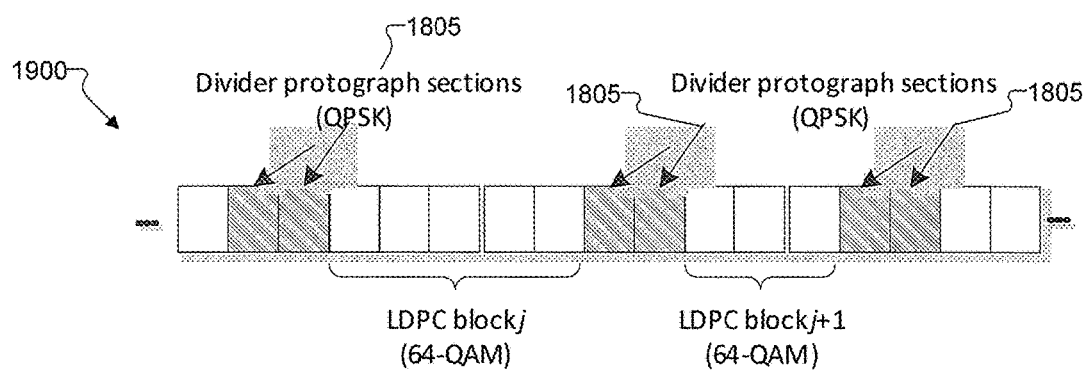
FIG. 19 illustrates a very long SC-LDPC code divided into several block LDPC codes using unequal error protection according to this disclosure.

FIG. 19 illustrates a very long SC-LDPC code divided into several block LDPC codes using unequal error protection according to this disclosure. The embodiment of the divided SC-LDPC code 1900 shown in FIG. 19 is for illustration only. Other embodiments could be used without departing from the scope of the present disclosure.

In certain embodiments, instead of using a known fixed pattern in the divider protograph sections 1805, the divider section 1805 carries information and parity bits, which have smaller bit-error probability than the other bits in the codeword. For example, one can use unequal error protection methods to create divider protograph sections as shown in the example shown in FIG. 19. These methods include: a) Lower modulation and coding scheme (MCS), namely, lower modulation order and/or lower coding rate; b) Narrower analog beam; and c) Smaller number of MIMO streams in case of MIMO transmission.

Figure 20:
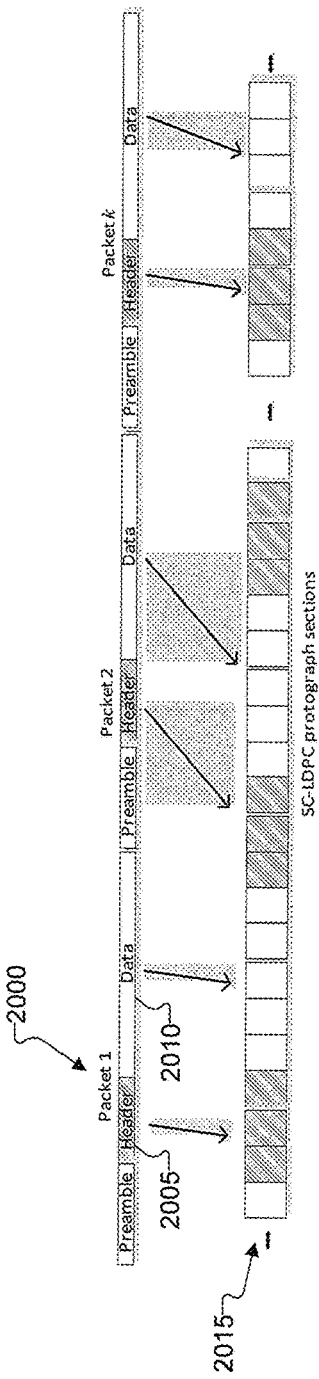
FIG. 20 illustrates utilizing the stronger header protection to create divider protograph sections according to this disclosure.
Figure 21:
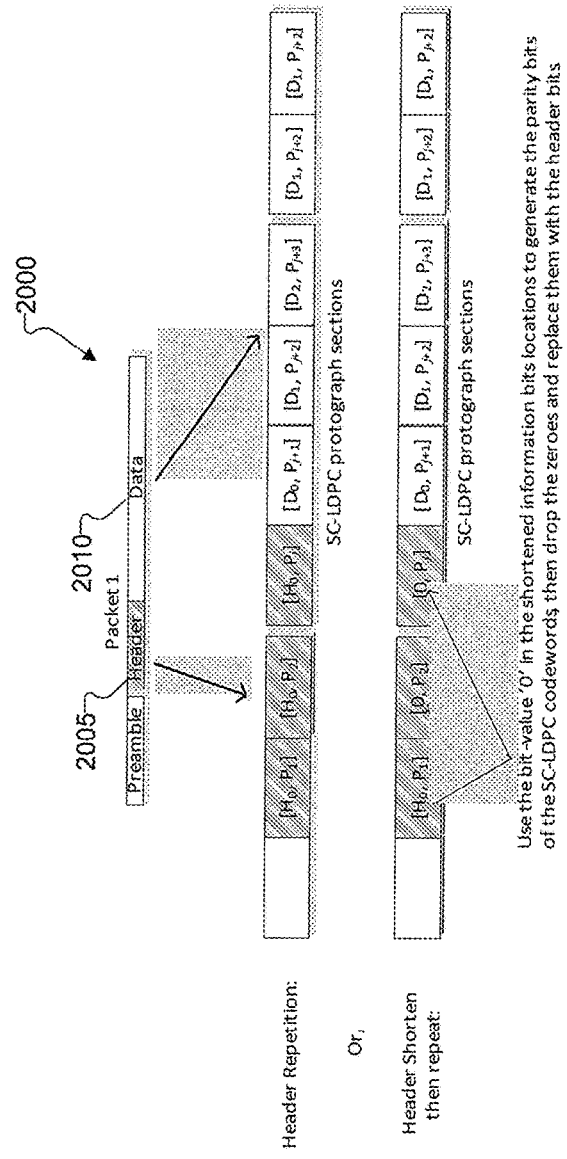
FIG. 21 illustrates an example for strengthening part of the SC-LDPC codeword using repetition or shorten-then-repeat process to carry the packet header according to this disclosure.

FIG. 20 illustrates utilizing the stronger header protection to create divider protograph sections according to this disclosure. FIG. 21 illustrates an example for strengthening part of the SC-LDPC codeword using repetition or shorten-then-repeat process to carry the packet header according to this disclosure. The embodiments shown in FIGS. 20 and 21 are for illustration only. Other embodiments could be used without departing from the scope of the present disclosure.

In certain embodiments, in a packet based communication system, such as WLAN IEEE 802.11, each packet 2000 consists of header 2005 and data (payload) 2010. It is typical that the header needs to be protected more than the data. In certain embodiments, for all the packets, which belong to large chunk of data such as one file transmission or one stream of data, the packets 2000 are encoded as a single SC-LDPC codeword 2015. The header 2005 of the packets 2000 will serve as the divider protograph sections. The header 2005 can be better protected using low modulation order (QPSK), no puncturing, repetition, shortening, or a combination of these methods. In the example shown in FIG. 21, the header information bits occupy one protograph section for illustration purpose only. In an actual system, the header information bits may occupy one or more protograph sections, and may require padding to fit in the protograph sections.

In certain embodiments, the header 2005 can be first encoded using an inner code; then, the information and parity bits of the inner code are encoded using the SC-LDPC code. In this case, the SC-LDPC will be the outer code with respect to the header section.

As the header 2005 contains information regarding how to demodulate and decode the packet data 2010, it is important to point out that the header 2005 should be decodable independent of the data 2010 following the header 2005. This can be done in several ways; one way is to make sure that the header occupies at least W protograph sections (the size of one decodable window), and to put the headers information bits in the $1^{st}$ few sections, while later sections carry repetitions and parity bits. Alternatively, one can use an inner code to decode the header 2005, then use the recovered header to decode the data 2010 and as a divider protograph section.

In certain embodiments, the structure shown in FIGS. 20 and 21, which encodes several packets 2000 into one using one SC-LDPC codeword, can be signaled using a field in the packet header 2005 to indicate that there is a continuation packet following this packet or indicate that there is not a continuation packet following this packet. Alternatively, there can be higher level signaling, such as MAC level messages, which setup the SC-LDPC encoding structure, such as the number of packets encoded jointly, the type of termination, the frequency of termination, the data modulation, and coding scheme, and the like.

Figure 22:
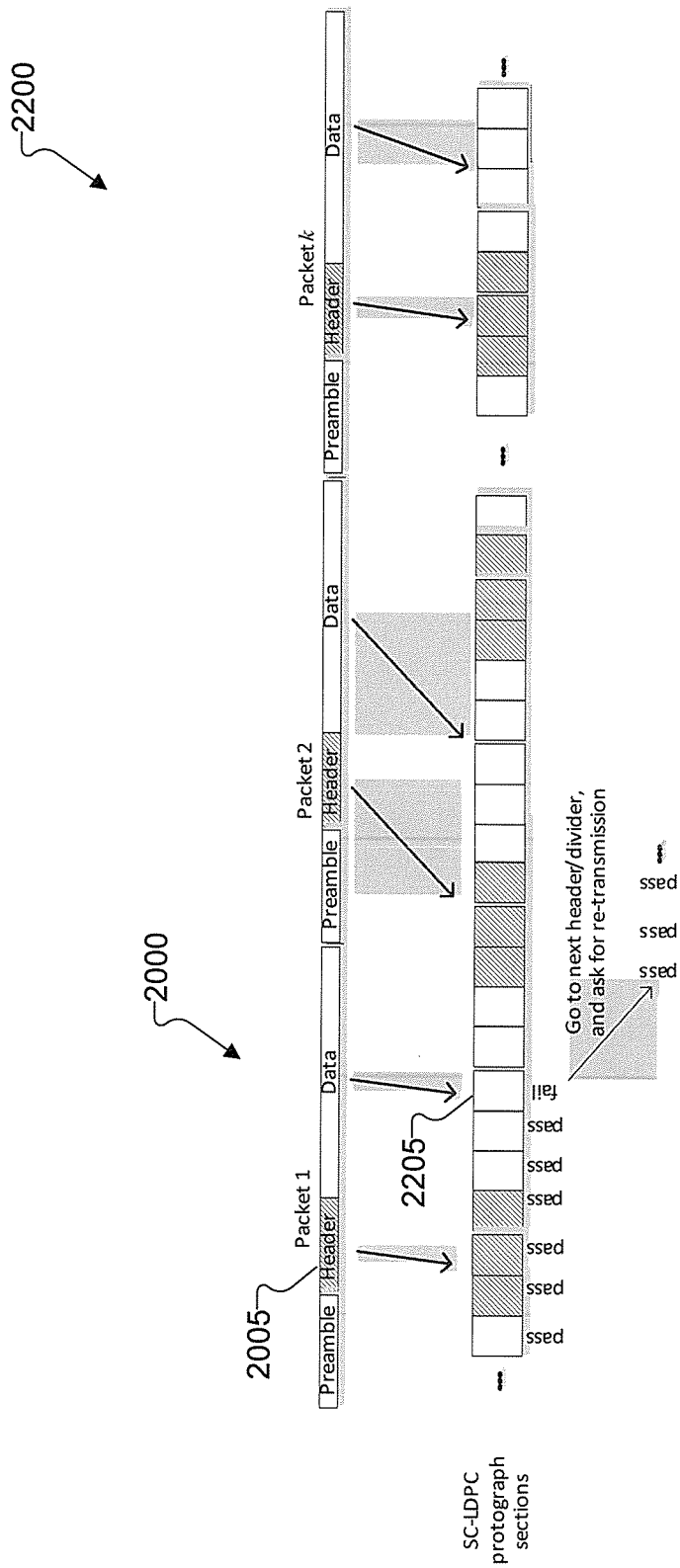
FIG. 22 illustrates an example on HARQ support using SC-LDPC coding scheme according to this disclosure.

FIG. 22 illustrates an example on HARQ support using SC-LDPC coding scheme according to this disclosure. The embodiment of the SC-LDPC coding scheme 2200 shown in FIG. 22 is for illustration only. Other embodiments could be used without departing from the scope of the present disclosure.

In certain embodiments, the SC-LDPC coding scheme supports hybrid automatic repeat request (HARQ) in the following way: The receiver decodes the protograph sections of the SC-LDPC code 1600 as long as it can recover the information bits in these sections. Once the decoder fails 2205, the decoder requests a retransmission of the related packet, and then the decoder keeps buffering the received information and waits for the retransmitted information.

Alternatively, the decoder can buffer at least the failed packet, all packets, or sections from the start of failure, and start decoding the header of the next packet.

The retransmission can be:
(1) Retransmission of all the bits related to the failed packet (to be chase combined at the receiver for example)
(2) Incremental redundancy retransmission by sending some or all the punctured bits (if any) related to this packet.
(3) Retransmission of all the bits (or incremental redundancy) related to the failed protograph section and all following sections until the end of the failed packet.
(4) Retransmission of all the bits (or incremental redundancy) related to the failed protograph section only or with few sections after it.

It is noted that retransmission schemes 3 and 4 above require the receiver to feedback information about which protograph section failed.

Code-Family Design: Shortening Versus Puncturing

In this section, the issue of designing a family of SC-LDPC codes to support multiple code rates is addressed. The following two candidate approaches are considered: 1) design an SC-LDPC ensemble with low code rate, and then puncture it to obtain codes with higher code rates. This approach is similar to the one used with convolutional codes, except here puncturing is performed on the protograph sections level, rather than on the bit level, that is, if a VN type in the SC-LDPC code is punctured, then all Z VNs of that type in the lifted SC-LDPC code will be punctured. 2) Design an SC-LDPC code ensemble with high code rate, and then shorten it into codes with lower code rates. This approach is similar to one used in designing the AR4JA LDPC code family discussed in Reference 19.

Embodiments of the present disclosure illustrate and compare the two code family design approaches by designing and simulating two example-families of SC-LDPC codes (one per approach). And so the presented results are meant to give a sense of how these two approaches compare in terms of BER performance and convergence speed, and how it is translated into computational complexity. Also in this disclosure, only codes with regular degree distribution (regular except for the terminations) are considered. Regular SC-LDPC codes have good decoding threshold, which is comparable to optimized irregular designs.

Figure 23:
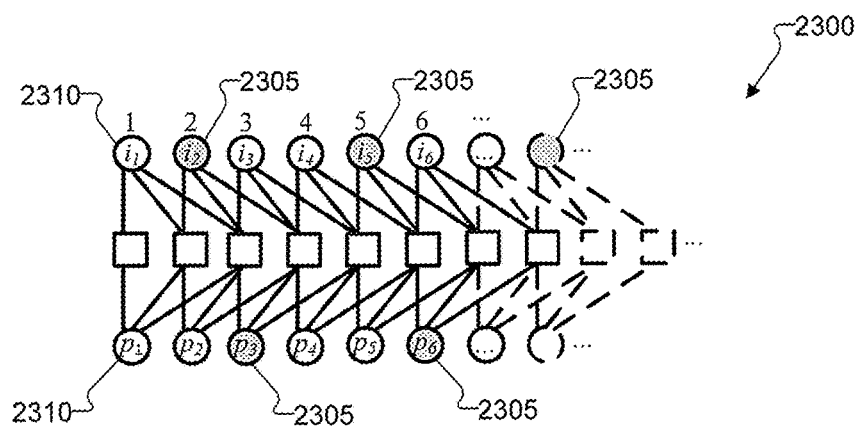
FIG. 23 illustrates an example for puncturing a (3, 6, L) SC-LDPC ensemble to rate-3/4 using a puncturing matrix [1, 0, 1; 1, 1, 0] according to this disclosure.

FIG. 23 illustrates an example for puncturing a (3, 6, L) SC-LDPC ensemble to rate-3/4 using a puncturing matrix [1, 0, 1; 1, 1, 0] according to this disclosure. The embodiment of the punctured code structure 2200 shown in FIG. 23 is for illustration only. Other embodiments could be used without departing from the scope of the present disclosure.

In the first code family, the (3, 6, 720) SC-LDPC code 1600 has the lowest rate (~rate-1/2). This SC-LDPC code 1600 is punctured to an "approximately" rate-2/3, rate-3/4, or rate-5/6 using the puncturing pattern [1, 0; 1 1,], [1, 0, 1; 1, 1, 0], or [1, 0, 1, 0, 1; 1, 1, 0, 1 0,], respectively. An example on puncturing the (3, 6, 720) SC-LDPC code 1600 to a rate-3/4 code is given in FIG. 23, where the grey circles 2305 indicate punctured VNs, and the white circles 2310 indicate transmitted VNs.

Figure 24:
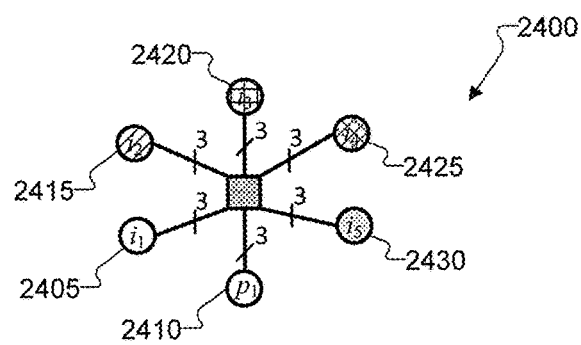
FIG. 24 illustrates a rate-5/6 (3, 18) LDPC code protogrpah, which can be shortend to rate-4/5, 3/4, 2/3, or 1/2 according to this disclosure.

FIG. 24 illustrates a rate-5/6 (3, 18) LDPC code protogrpah, which can be shortend to rate-4/5, 3/4, 2/3, or 1/2 according to this disclosure. The embodiment of the protograph 2400 shown in FIG. 24 is for illustration only. Other embodiments could be used without departing from the scope of the present disclosure.

Figure 25:
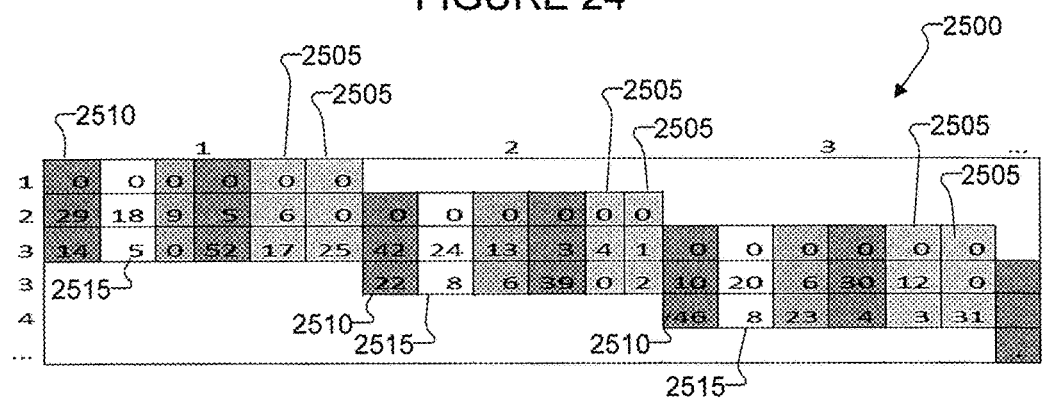
FIG. 25 illustrates a (3, 18, L) SC-LDPC code protogrpah with rate-5/6, which can be shortend to rate-4/5, 3/4, 2/3, or 1/2 according to this disclosure.

In the second code family, a (3, 18, L) SC-LDPC code ensemble is designed based on the protograph 2400 in FIG. 24. Then, this code is lifted using Z=112 cyclic permutation matrices into a time-variant quasi-cyclic SC-LDPC code with periodicity equal three. The parity check matrix 2500 for the designed code is illustrated in FIG. 25. The permutation matrices were chosen in a hierarchal way: first, the ones lifting $i_1$ 2405 and $p_1$ 2410, fifth and sixth columns 2505 in FIG. 25, were chosen to maximize the girth of the first nine protograph sections of the code, where all other permutations were set to the Z×Z all-zeroes matrices. Then the permutation matrices lifting $i_2$ 2415 were added to maximize the girth, and so on lifting $i_3$ 2420, $i_4$ 2425, and finally $i_5$ 2430. To shorten this code to a rate-4/5 code, all first columns 2510 are deleted (i.e., set all VNs in $i_5$ to '0', then delete them before transmission). To shorten it to a rate-3/4 code, all first columns 2510 and second columns 2515 are deleted, and so forth, the code can be further shortened to obtain rate-2/3 and rate-1/2 codes.

In the punctured code family, the number of information bits in a codeword is fixed and equal to 80416 bits. In the shortened code family, the number of protograph copies L is adjusted for each code rate to keep the number of information bit in a codeword 80416. Consequently, L=720, 360, 240, and 144 for rate-1/2, 2/3, 3/4, and 5/6, respectively. Also, trying to keep a fair comparison, the size of the decoding window is varied such that the number of VNs in the decoding window is 30. That is W=15 for all codes in the punctured code family, and W=15, 10, 7, and 5 for the rate-1/2, 2/3, 3/4, and 5/6, respectively, of the shortened code family (For rate-3/4, W should be 7.5, but it was approximated to 7).

Figure 26:
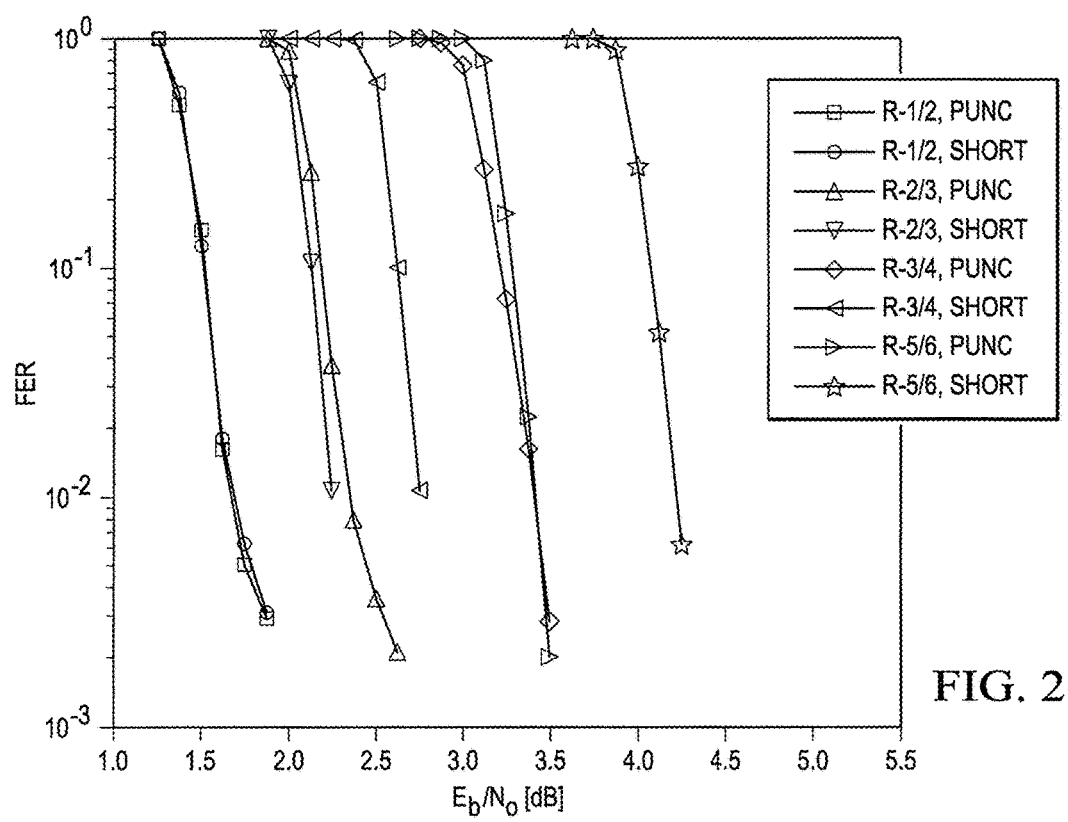
FIG. 26 illustrates FER performance comparison between the punctured code family and the shortened code family according to this disclosure.
Figure 27:
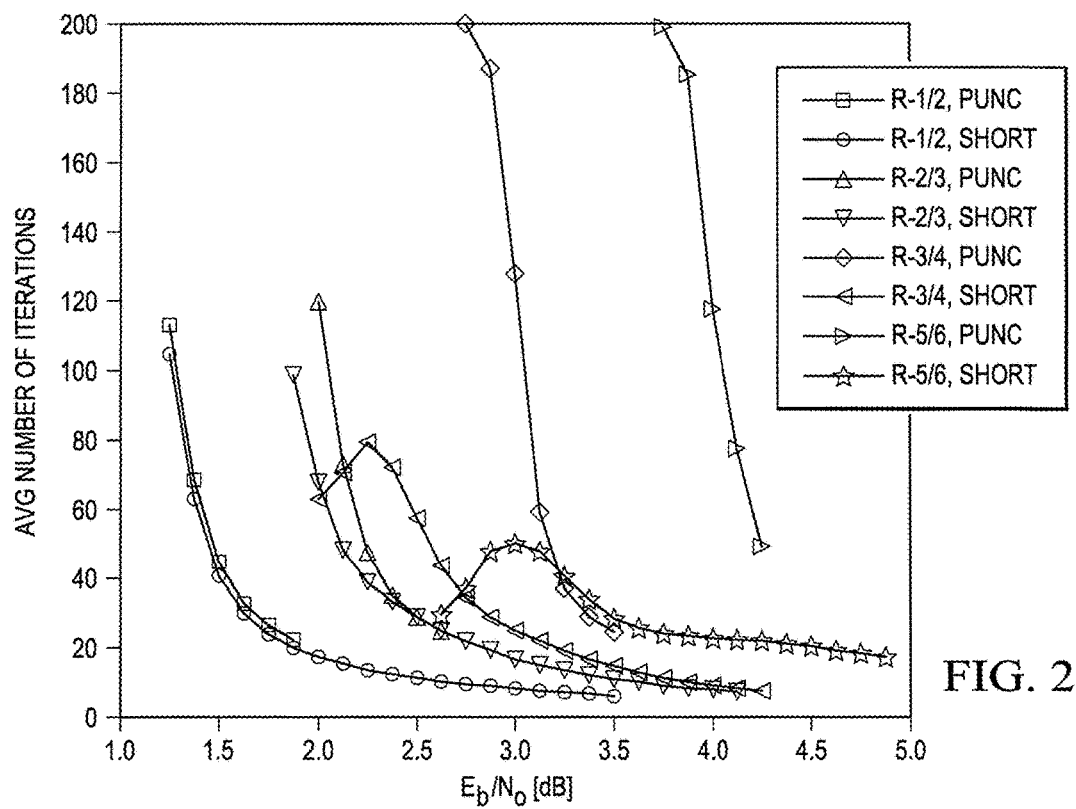
FIG. 27 illustrates Number of iterations performance comparison between the punctured code family and the shortened code family according to this disclosure.

The FER and average number of iterations results in FIG. 26 and FIG. 27 show that the rate-1/2 codes in the punctured and the shortened code families have similar performance. The rate-2/3 code in the shortened code family performs slightly better than that in the punctured code family. The rate-3/4 code in the shortened code family outperforms that in the punctured code family by 0.6 dB in term of FER performance, and provides a reduction of more than 12 iterations per VN on average at any given SNR point. The rate-5/6 code in the shortened code family outperforms that in the punctured code family by 0.9 dB in term of FER designed shortened code family performs better than the punctured code family.

Although the codes in the shortened code family require less average number of iterations per VN, this may not necessarily results in lower computation complexity. It is noted that the codes in this family have CNs of larger degree than that in the punctured code family, and this should be taken in consideration in the computation complexity comparison. For computation complexity, it is assumed: the use of the scaled Min-Sum decoder, in which a CN with degree (per iteration) requires two addition operations for scaling, $3(d_c-2)$ compare operations for finding the minimum, and $2d_c-1$ XOR operation for computing the sign. Moreover, a VN with degree $d_v$ requires $2d_v-1$ addition operations per iteration. It is further assumed that one addition operation is equivalent to one compare operation, or eight XOR operations, then the shortened/punctured complexity ratio is defined as the number of XOR operations per decoding a VN in the shortened code family divided by the number of XOR operations per decoding a VN in the punctured code family. Moreover, the comparison can be made on the same SNR point or at the same FER performance. The complexity ration is summarized in Table I.

Embodiments of the present disclosure provide an early stopping rule for window decoding of SC-LDPC codes. The early stopping rule is based on partial syndrome-check, which performs only XOR operations. Embodiments of the present disclosure also propose a zigzag-window decoder, which allows for pushing the information backward from the end of a divergence. The proposed zigzag-window decoder together with the proposed early stopping rule has a similar FER performance as the full-block decoder, and it reduces the average number of iterations per VN from 55 for the full-block decoder to 30 at FER=1e−2.

Two examples of code families supporting different rates via puncturing, or shortening were compared. The results show that the shortened code family performs better than the punctured code family, and have lower computation complexity, especially for the high rate codes.

Figure 28:
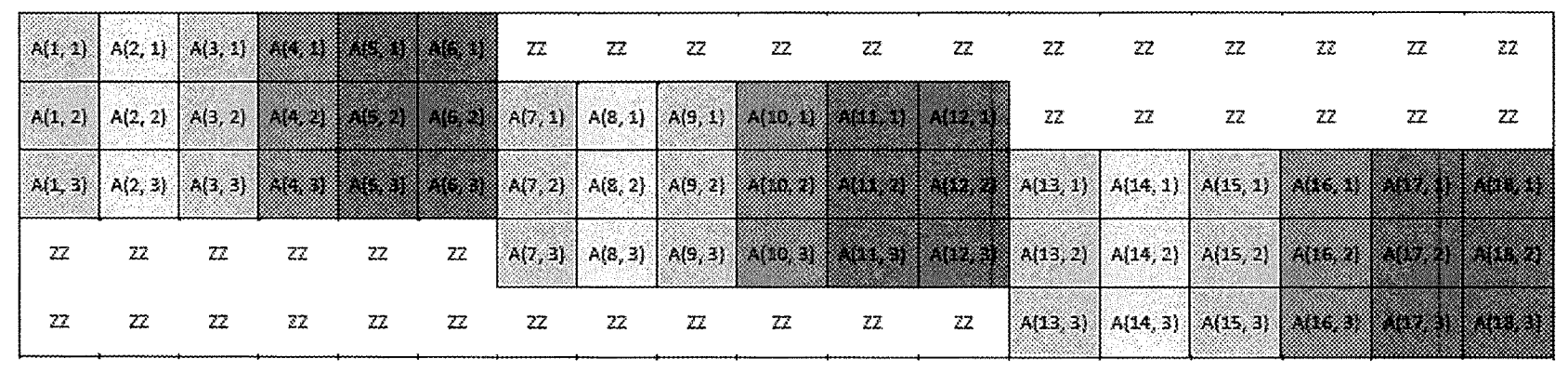

FIG. 28 illustrates Exemplary SC-LDPC code families based on shortening according to this disclosure. The embodiment of the SC-LDPC code families 2800 shown in FIG. 28 is for illustration only. Other embodiments could be used without departing from the scope of the present disclosure.

FIG. 28 shows three protograph sections of the parity check matrix for the code with the highest code rate in the family, where ZZ refers to the Z×Z all-zeroes matrix, and the values $A(i, j)$ is taken from $i^{th}$ row and the $j^{th}$ column of the matrices below (depending on the lifting factor Z):

1) For Z = 112, lifting Matrix =

| 0 | 29 | 14 |
|---|----|----|
| 0 | 18 | 5 |
| 0 | 9 | 0 |
| 0 | 5 | 52 |
| 0 | 6 | 17 |
| 0 | 0 | 25 |
| 0 | 42 | 22 |
| 0 | 24 | 8 |
| 0 | 13 | 6 |
| 0 | 3 | 39 |
| 0 | 4 | 0 |
| 0 | 1 | 2 |
| 0 | 10 | 46 |
| 0 | 20 | 8 |
| 0 | 6 | 23 |
| 0 | 30 | 4 |
| 0 | 12 | 3 |
| 0 | 0 | 31 |

2) For Z = 42, lifting Matrix =

| 0 | 2 | 1 |
|---|---|---|
| 0 | 1 | 3 |
| 0 | 12 | 39 |
| 0 | 18 | 0 |
| 0 | 6 | 17 |
| 0 | 0 | 26 |
| 0 | 3 | 1 |
| 0 | 0 | 8 |
| 0 | 16 | 6 |
| 0 | 9 | 3 |
| 0 | 4 | 0 |
| 0 | 1 | 2 |
| 0 | 4 | 0 |
| 0 | 2 | 16 |
| 0 | 6 | 25 |
| 0 | 3 | 10 |
| 0 | 12 | 4 |
| 0 | 0 | 5 |

3) For Z = 27, lifting Matrix =

| 0 | 2 | 3 |
|---|---|---|
| 0 | 4 | 1 |
| 0 | 10 | 21 |
| 0 | 9 | 16 |
| 0 | 8 | -1 |
| 0 | 1 | 0 |
| 0 | 4 | 3 |
| 0 | 0 | 2 |
| 0 | 25 | 13 |
| 0 | 9 | 6 |
| 0 | 5 | 1 |
| 0 | 2 | 0 |
| 0 | 3 | 1 |
| 0 | 1 | 4 |
| 0 | 12 | 11 |
| 0 | 9 | 3 |
| 0 | 0 | 0 |
| 0 | 5 | 2 |

-continued
4) For Z = 24, lifting Matrix =

| 0 | 7  | 2  |
|---|----|----|
| 0 | 3  | 10 |
| 0 | 2  | 1  |
| 0 | 19 | 0  |
| 0 | 6  | 17 |
| 0 | 0  | 3  |
| 0 | 10 | 3  |
| 0 | 6  | 1  |
| 0 | 2  | 18 |
| 0 | 14 | 8  |
| 0 | 4  | 0  |
| 0 | 1  | 2  |
| 0 | 4  | 2  |
| 0 | 5  | 1  |
| 0 | 3  | 0  |
| 0 | 6  | 11 |
| 0 | 2  | 3  |
| 0 | 0  | 4  |

To aid the Patent Office and any readers of any patent issued on this application in interpreting the claims appended hereto, applicants wish to note that they do not intend any of the appended claims or claim elements to invoke 35 U.S.C. §112(f) unless the words "means for" or "step for" are explicitly used in the particular claim. Use of any other term, including without limitation "mechanism," "module," "device," "unit," "component," "element," "member," "apparatus," "machine," "system," "processor," or "controller," within a claim is understood by the applicants to refer to structures known to those skilled in the relevant art and is not intended to invoke 35 U.S.C. §112(f).

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. An apparatus comprising:
    an input buffer configured to receive a protograph-based spatially coupled low density parity check (SC-LDPC) code from a transmitter; and
    a decoder processing circuitry configured to perform a SC-LDPC decoding operation on the SC-LDPC code, the SC-LDPC code comprising a parity check matrix, wherein the SC-LDPC decoding operation comprises:
    a sliding window comprising a subset of protograph sections on which decoding calculations are iteratively performed, wherein the sliding window has a forward direction and a backward direction; and
    a stopping rule configured to cease the decoding calculations as a function of a partial-syndrome check in the sliding window.

2. The apparatus as set forth in claim 1, wherein the decoder processing circuitry is configured to, within the sliding window:
    perform an iterative decoding algorithm when the sliding window is in a first position, P=1;
    perform the iterative decoding algorithm when the sliding window is in a second position, P=2; and
    perform the iterative decoding algorithm is performed when the sliding window is in a third position, P=3.

3. The apparatus as set forth in claim 1, wherein the stopping rule comprises:
    checking a partial syndrome for one or more check nodes (CNs) in $W_S$,
    if syndrome-check passes or maximum number of iterations is reached, outputting a decision for variable nodes (VNs) in respective protograph sections S, and updating a location of the sliding window.

4. The apparatus as set forth in claim 1, wherein the sliding window comprises a zigzag-sliding window.

5. The apparatus as set forth in claim 4, wherein the decoder processing circuitry is configured to, in the zigzag-sliding window, decode the SC-LDPC code in two directions, the two directions comprising a forward direction in which the sliding window advances right by at least one protograph section, and a backward direction in which the sliding window advances left by the at least one protograph section.

6. The apparatus as set forth in claim 5, wherein the decoder processing circuitry is configured to, in the zigzag-sliding window, decode in a zigzag round (Z-round), the Z-round comprising a first iteration calculation performed in the forward direction, a second iteration calculation performed in a backward direction; and a third calculation iteration performed in a forward direction.

7. The apparatus as set forth in claim 1, wherein the SC-LDPC code is transmitted as part of a packet, the packet comprising at least a header and a payload, wherein the header is configured as a divider protograph section to divide protograph sections of one or more SC-LDPC codes.

8. The apparatus as set forth in claim 7, wherein at least one of:
    the header is protected using one or more of: low modulation order (QPSK), no puncturing, repetition, or shortening; or
    header information bits occupy one or more protograph sections.

9. The apparatus as set forth in claim 7, wherein the header is first encoded using an inner code; then, information and parity bits of the inner code are encoded using the SC-LDPC code, and wherein the header is configured to be decodable independent of data following the header by at least one of:
    configuring the header to occupy at least W protograph sections; or
    placing information bits in a first few sections, while later sections carry repetitions and parity bits; or
    using an inner code to decode the header, then using the decoded header to decode the data and as a divider protograph section.

10. The apparatus as set forth in claim 7, wherein several packets are encoded into one using a single SC-LDPC codeword are signaled using a field in the header to indicate one of:
    a continuation packet follows the packet; or
    a continuation packet does not following the packet.

11. The apparatus as set forth in claim 7, wherein the SC-LDPC coding scheme supports hybrid automatic repeat request (HARQ), and wherein the decoder processing circuitry is configured to decode the protograph sections of the SC-LDPC code as long as the decoder processing circuitry is able to recover information bits in the protograph sections, and wherein in response to the decoder processing circuitry failing, the decoder processing circuitry is configured to:

request a retransmission of a related packet and continue buffering received information while waiting for the retransmitted related packet; or buffer at least a failed packet, all packets, or sections from a start of failure, and start decoding the header of a next packet.

12. The apparatus as set forth in claim 11, wherein the decoder processing circuitry is configured to decrease a rate of the SC-LDPC by a shortening operation.

13. The apparatus as set forth in claim 11, wherein the retransmission is one of:
a retransmission of all bits related to the failed packet;
an incremental redundancy retransmission comprising a sending of some or all punctured bits related to this packet;
a retransmission of all bits or incremental redundancy related to a failed protograph section and all following sections until an end of the failed packet; or
a retransmission of all the bits or incremental redundancy related to the failed protograph section only or with few sections after the failed protograph section.

14. A method comprising:
receiving a protograph-based spatially coupled low density parity check (SC-LDPC) code from a transmitter; and
performing an SC-LDPC decoding operation on the SC-LDPC code, the SC-LDPC code comprising a parity check matrix, wherein the SC-LDPC decoding operation comprises:
a sliding window comprising a subset of protograph sections on which decoding calculations are iteratively performed, wherein the sliding window has a forward direction and a backward direction; and
a stopping rule configured to cease the decoding calculations as a function of a partial-syndrome check in the sliding window.

15. The method as set forth in claim 14, wherein the SC-LDPC decoding operation comprises, within the sliding window:
performing an iterative decoding algorithm when the sliding window is in a first position, P=1;
performing the iterative decoding algorithm when the sliding window is in a second position, P=2; and
performing the iterative decoding algorithm is performed when the sliding window is in a third position, P=3.

16. The method as set forth in claim 14, wherein the stopping rule comprises:
checking a partial syndrome for one or more check nodes (CNs) in $W_S$;
if syndrome-check passes or maximum number of iterations is reached, outputting a decision for variable nodes (VNs) in respective protograph sections S, and updating a location of the sliding window.

17. The method as set forth in claim 14, wherein the sliding window comprises a zigzag-sliding window.

18. The method as set forth in claim 17, wherein the SC-LDPC decoding operation comprises, in the zigzag-sliding window, decoding the SC-LDPC code in two directions, the two directions comprising a forward direction in which the sliding window advances right by at least one protograph section, and a backward direction in which the sliding window advances left by the at least one protograph section.

19. The method as set forth in claim 18, wherein the SC-LDPC decoding operation comprises, in the zigzag-sliding window, decoding in a zigzag round (Z-round), the Z-round comprising a first iteration calculation performed in the forward direction, a second iteration calculation performed in a backward direction; and a third calculation iteration performed in a forward direction.

20. The method as set forth in claim 14, wherein receiving the SC-LDPC code comprises receiving the SC-LDPC code as part of a packet, the packet comprising at least a header and a payload, wherein the header is configured as a divider protograph section to divide protograph sections of one or more SC-LDPC codes.

21. The method as set forth in claim 20, wherein at least one of:
the header is protected using one or more of: low modulation order (QPSK), no puncturing, repetition, or shortening; or
header information bits occupy one or more protograph sections.

22. The method as set forth in claim 20, wherein the header is first encoded using an inner code; then, information and parity bits of the inner code are encoded using the SC-LDPC code, and wherein the header is configured to be decodable independent of data following the header by at least one of:
configuring the header to occupy at least W protograph sections; or
placing information bits in a first few sections, while later sections carry repetitions and parity bits; or
using an inner code to decode the header, then using the decoded header to decode the data and as a divider protograph section.

23. The method as set forth in claim 20, wherein several packets are encoded into one using a single SC-LDPC codeword are signaled using a field in the header to indicate one of:
a continuation packet follows the packet; or
a continuation packet does not following the packet.

24. The method as set forth in claim 20, wherein the SC-LDPC coding scheme supports hybrid automatic repeat request (HARQ), wherein SC-LDPC decoding operation is performed using decoder processing circuitry, and wherein the decoder processing circuitry is configured to decode the protograph sections of the SC-LDPC code as long as the decoder processing circuitry is able to recover information bits in the protograph sections, and wherein in response to the decoder processing circuitry failing, the decoder processing circuitry is configured to:
request a retransmission of a related packet and continue buffering received information while waiting for the retransmitted related packet; or
buffer at least a failed packet, all packets, or sections from a start of failure, and start decoding the header of a next packet.

25. The method as set forth in claim 24, wherein the retransmission is one of:
a retransmission of all bits related to the failed packet;
an incremental redundancy retransmission comprising a sending of some or all punctured bits related to this packet;
a retransmission of all bits or incremental redundancy related to a failed protograph section and all following sections until an end of the failed packet; or
a retransmission of all the bits or incremental redundancy related to the failed protograph section only or with few sections after the failed protograph section.

26. The method as set forth in claim 24, wherein the decoder processing circuitry is configured to decrease a rate of the SC-LDPC by a shortening operation and wherein the shortening operation comprises using a shortening pattern.

27. A receiver comprising:
- at least one antenna configured to receive a protograph-based spatially coupled low density parity check (SC-LDPC) code from a transmitter; and
- a sliding window-decoder configured to perform a SC-LDPC decoding operation on the SC-LDPC code using a sliding window, the SC-LDPC code comprising a parity check matrix, wherein the sliding window comprises a subset of protograph sections on which decoding calculations are iteratively performed and the sliding window has two directions comprising a forward direction and a backward direction, and wherein the sliding window-decoder performs a stopping rule configured to cease the decoding calculations as a function of a partial-syndrome check in the sliding window.

28. The receiver as set forth in claim 27, wherein the stopping rule comprises:
- checking the syndrome for one or more check nodes (CNs) in S,
- if syndrome-check passes or maximum number of iterations is reached, outputting a decision for variable nodes (VNs) in the one or more CNs, and
- updating a location of the sliding window.

29. The receiver as set forth in claim 27, wherein the sliding window decoder comprises a zigzag-sliding window decoder configured to, in the zigzag-sliding window, decode the SC-LDPC code in two directions, the two directions comprising a forward direction in which the sliding window advances right by at least one protograph section, and a backward direction in which the sliding window advances left by the at least one protograph section.

* * * * *